(12) United States Patent
Taniguchi

(10) Patent No.: US 6,310,493 B1
(45) Date of Patent: Oct. 30, 2001

(54) SEMICONDUCTOR INTEGRATED CIRCUIT

(75) Inventor: Hideki Taniguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/599,646

(22) Filed: Jun. 23, 2000

(30) Foreign Application Priority Data

Feb. 9, 2000 (JP) .................................................. 12-032419

(51) Int. Cl.[7] .......................... H03K 9/0175; H03K 17/16
(52) U.S. Cl. ............................ 326/81; 326/58; 326/68; 327/333
(58) Field of Search .................................. 326/81, 57, 27, 326/83, 86, 58, 56, 80, 68, 26; 327/387, 391, 333

(56) References Cited

U.S. PATENT DOCUMENTS

| | | | |
|---|---|---|---|
| 5,534,795 | * 7/1996 | Wert et al. | ............................. 326/81 |
| 5,748,011 | * 5/1998 | Takahashi et al. | ..................... 326/83 |
| 5,834,948 | * 11/1998 | Yoshizaki et al. | ..................... 326/81 |

* cited by examiner

*Primary Examiner*—Michael Tokar
*Assistant Examiner*—Daniel D. Chang
(74) *Attorney, Agent, or Firm*—Leydig, Voit & Mayer, Ltd.

(57) ABSTRACT

In a semiconductor integrated circuit, an input-output circuit includes a flip-flop circuit (a front stage of an output circuit) between an input circuit unit and a tri-state output circuit unit (a final stage of an output circuit). This input-output circuit converts the level of the signal supplied from an internal circuit, which is operated by a first power source system, which provides a first supply potential and a grounding potential, of an LSI. After elapse of a certain time delay, the input-output circuit outputs a level converted signal to a device, which is operated by a second power source system, providing a second supply potential and a grounding potential, outside of the LSI.

6 Claims, 13 Drawing Sheets

| N11 | N12 | N14 | N13 | N15 | N16 | PAD (3) |
|---|---|---|---|---|---|---|
| IN1 | L | H | ↑ | IN1 | L | IN1 |
|  | H |  | ↑ |  | H | Z |
| X | X | L | X | H | H | Z |

FIG.6

| N21 | N23 | S | T | N21 (N31) | N22 (N32) | N23 (N33) | N24 (N34) | PAD (3) |
|---|---|---|---|---|---|---|---|---|
| IN1 | L | H | ↑ | IN1 | $\overline{IN1}$ | L | H | IN1 |
| IN1 | H | H | ↑ | IN1 | $\overline{IN1}$ | H | L | Z |
| X | X | L | X | H | L | H | L | Z |

FIG.11

| A | C | T | N51 (N61) | N52 (N62) | (N63) | PAD (3) |
|---|---|---|---|---|---|---|
| IN1 | L | ↑ | IN1 | L | H | IN1 |
|  | H | ↑ |  | H | L | Z |
| X | X | X | H | H | L | Z |

SEMICONDUCTOR INTEGRATED CIRCUIT

FIELD OF THE INVENTION

The present invention relates to a semiconductor integrated circuit having input-output circuit having complementary metal oxide semiconductor (CMOS) structure. More particularly, this invention relates to a semiconductor integrated circuit capable of exchanging signals easily between circuits with other semiconductor integrated circuits driven by mutually different supply voltages.

BACKGROUND OF THE INVENTION

FIG. 14 is a circuit diagram of an input-output circuit in a conventional semiconductor integrated circuit with a signal level converting function. The signal level converting function in such a semiconductor integrated circuit means the following two functions.

(1) Converting the level of signal voltage issued from an internal circuit operated at a supply voltage of the semiconductor integrated circuit, and supplying the newly obtained voltage to an external circuit operated at a supply voltage different from this supply voltage (that is, an internal circuit of other semiconductor integrated circuit); and (2) Converting the level of signal voltage received from an external circuit operated at a supply voltage different from the supply voltage of the semiconductor integrated circuit, and supplying the newly obtained voltage to an internal circuit.

The input-output circuit shown in FIG. 14 includes an output buffer circuit 12h, an electrostatic protective circuit 8, and an input buffer circuit 9. As shown in FIG. 14, the output buffer circuit 12h is composed of an input circuit unit 10h and an output circuit unit 11h. The input circuit unit 10h is classified into a circuit unit operated at a first supply potential VDD1 and a circuit unit operated at a second supply potential VDD2.

As shown in FIG. 14, the input circuit unit 10h is divided into two sections of a first signal processing unit and a second signal processing unit. The first signal processing unit receives a data input signal IN1 issued from the internal circuit into an input terminal 1 and processes this data input signal IN1. The second signal processing unit receives an output control signal IN2 issued from the internal circuit into a control terminal 2 and processes this output control signal IN2.

The first signal processing unit is composed of a PMOS transistor MP111, an NMOS transistor MN111, a PMOS transistor MP112, an NMOS transistor MN112, and an inverter G111. The PMOS transistor MP111 has its source connected to the second supply potential VDD2. The NMOS transistor MN111 has its source connected to the grounding potential GND, drain connected to the drain of the PMOS transistor MP111 and gate connected to the input terminal 1. The PMOS transistor MP112 has its source connected to the second supply potential VDD2, and gate connected to the drain of the NMOS transistor MN111. The NMOS transistor MN112 has its drain connected to the gate of the PMOS transistor MP111 and the drain of the PMOS transistor MP112. The input terminal of the inverter G111 is connected to the input terminal 1 and the output terminal is connected to the gate of the NMOS transistor MN112. The point where the gate of the PMOS transistor MP111, the drain of the PMOS transistor MP112, and the drain of the NMOS transistor MN112 are connected to each other will be referred to as node N111.

Thus, the first signal processing unit is a circuit which converts the level of the data input signal IN1 received from the internal circuit and supplies the newly obtained signal to the node N111.

On the other hand, the second signal processing unit is composed of a PMOS transistor MP113, an NMOS transistor MN113, a PMOS transistor MP114, an NMOS transistor MN114, and an inverter G112. The PMOS transistor MP113 has its source connected to the second supply potential VDD2. The NMOS transistor MN113 has its source connected to the grounding potential GND, drain connected to the drain of the PMOS transistor MP113 and gate connected to the control terminal 2. The PMOS transistor MP114 has its source connected to the second supply potential VDD2, and gate connected to the drain of the NMOS transistor MN113. The NMOS transistor MN114 has its drain connected to the gate of the PMOS transistor MP113 and the drain of the PMOS transistor MP114. The input terminal of the inverter G112 is connected to the control terminal 2 and the output terminal is connected to the gate of the NMOS transistor MN114. The point where the gate of the PMOS transistor MP113, the drain of the PMOS transistor MP114, and the drain of the NMOS transistor MN114 are connected to each other will be referred to as node N112.

Thus, the second signal processing unit is a circuit which converts the level of the output control signal IN2 received from the internal circuit and supplies the newly obtained signal to node N112.

In particular, the first and second signal processing units operate, supposing the operating voltage of the internal circuit to be first supply potential VDD1, as a latch signal level converting circuit which converts the level of the signal of the first supply potential VDD1 level into a signal of the second supply potential VDD2 level.

As mentioned above, the input circuit unit 10h is divided into a circuit which operates at the first supply potential VDD1 and a circuit which operates at the second supply potential VDD2. The former circuit comprises the inverters G111 and G112. The latter circuit comprises the PMOS transistors MP111 and MP112, NMOS transistors MN111 and MN112, PMOS transistors MP113 and MP114, and NMOS transistors MN113 and MN114.

In FIG. 14, the symbol "VDD1←" indicates the circuit that operates at the first supply potential VDD1 which is the supply voltage of the internal circuit. On the other hand, and the symbol "→VDD2" indicates the circuit that operates at the second supply potential VDD2. Although the internal circuit is not shown in this diagram, this internal circuit operates at the first supply potential VDD1. Further, an output circuit unit 11h, which will be explained below, operates at the second supply potential VDD2. It is assumed here that a relation of VDD2>VDD1>GND holds.

The output circuit unit 11h is composed of an inverter G113, a two-input NAND gate G114, a two-input NOR gate G115, a PMOS transistor MP115, and an NMOS transistor MN115. The inverter G113 has its input terminal connected to the node N112. The two-input NAND gate G114 has one of its input terminals connected to the node N111 and the other input terminal connected to the output terminal of the inverter G113. The two-input NOR gate G115 has one of its input terminals connected to the node N111 and the other input terminal connected to the node N112. The PMOS transistor MP115 has its source connected to the second supply potential VDD2 and gate connected to the output terminal (node N114) of the NAND gate G114. The NMOS transistor MN115 has its drain connected to the drain of the PMOS transistor MP115, its source connected to the grounding potential GND, and its gate connected to the output terminal (node N115) of the NOR gate G115. This output circuit unit 11h operates on the second supply potential VDD2.

The gate insulating film of the MOS transistors which compose the PMOS transistors MP111 to MP115, NMOS transistors MN111 to MN115, inverter G113, NAND gate G114, and NOR gate G115 is thicker than the gate insulating film of the MOS transistors which compose the inverters G111 and G112. Such an arrangement is provided in order to prevent damage of the gate insulating films of these MOS transistors.

The electrostatic protective circuit 8 is connected to the input-output terminal 3 (PAD terminal). This electrostatic protective circuit 8 functions to protect the output buffer circuit 12h from electrostatic breakdown in the following manner. That is, when an input signal of high potential is input from the input-output terminal 3 the electrostatic protective circuit 8 establishes a low impedance state, on the other hand, when an input signal of low potential or operating voltage is input the electrostatic protective circuit 8 establishes a high impedance state. This electrostatic protective circuit 8 is formed by combining a junction diode, a diffusion region, and a resistance element using a polysilicon layer on a substrate.

The input buffer circuit 9 comprises a circuit converts the signal level of an external input signal having the H level and L level defined by the second supply potential VDD2 and grounding potential GND into signals having the H level and L level defined by the first supply potential VDD1 and grounding voltage GND. The input buffer circuit 9 also comprises an input driver circuit.

As mentioned above, the semiconductor integrated circuit shown in FIG. 14 is a circuit which transmits a signal from an internal circuit to an external circuit while converting the signal level, that is, a device which converts the level of the signal supplied from inside of the LSI (large-scale integrated circuit) operated by the first power supply system in which the first supply potential VDD1 and grounding potential GND are supplied, and supplying to a device outside of the LSI operated by the second power supply system in which the second supply potential VDD2 and grounding potential GND are supplied.

The operation of this conventional semiconductor integrated circuit with signal level converting function is explained below. To begin with, the operation mode (input mode) of receiving a signal from the external circuit through the input-output terminal 3, and converting the signal level of the entered signal will be explained.

This input mode operates when the control signal IN2 becomes H level. By the control signal IN2 of this H level, the NMOS transistor MN113 is turned on, and the potential of the drain of the NMOS transistor MN113 drops to the grounding potential GND, and the PMOS transistor MP114 having the gate connected to its drain is turned on.

The inverter G112 outputs a signal of L level when it receives the control signal IN2 of H level, and hence the NMOS transistor MN114 having the gate connected to the output terminal of this inverter G112 is turned off. As a result, the PMOS transistor MP114 is turned on, and the potential of the node N112 rises to the second supply potential VDD2, so that the PMOS transistor MP113 is turned off. Thus, the node N112 becomes H level.

In this input mode state, when the data input signal IN1 becomes H level, the NMOS transistor MN111 is turned on, and the potential of the drain of the NMOS transistor MN111 declines to the grounding potential GND, thereby turning on the PMOS transistor MP112 having the gate connected to its drain.

At this point, the inverter G111 outputs a signal of L level when it receives a data input signal IN1 of H level, and therefore the NMOS transistor MN112 having the gate connected to the output terminal of this inverter G111 is turned off. Therefore, the potential at the node N111 raises to the second supply potential VDD2 as the PMOS transistor MP112 is turned on, and thereby the PMOS transistor MP111 is turned off. Thus, the node N111 also becomes H level.

On the other hand, when the data input signal IN1 becomes L level, the NMOS transistor MN111 is turned off, and the inverter G111 outputs a signal of H level when it receives a data input signal IN1 of L level, so that the NMOS transistor MN112 having the gate connected to the output terminal of this inverter G111 is turned on.

Consequently, the potential of the node N111 drops to the grounding potential GND and the PMOS transistor MP111 is turned on. Further, the potential of the drain of the PMOS transistor MP111 rises to the second supply potential VDD2. Therefore, the PMOS transistor MP112 is turned off, and consequently the node N111 becomes L level.

Accordingly, in the input mode, whether the data input signal IN1 is at L level or H level, as far as the control signal IN2 is at H level, the node N112 is at H level, and a signal of L level is input into one of the input terminals of the NAND gate G114 through the inverter G113. Therefore, the node N114, which is the output of the NAND gate G114, is H level, and the PMOS transistor MP115 is turned off.

In this case, a signal of H level is input into one of the input terminals of the NOR gate G115, and the node N115, which is the output of the NOR gate G115, becomes L level, and the NMOS transistor MN115 is turned off. Since both the PMOS transistor MP115 and NMOS transistor MN115 are turned off, the junction of the drain of the PMOS transistor MP115 and the drain of the NMOS transistor MN115 becomes a high impedance state with respect to the input-output terminal 3. Thus, the output buffer circuit 12h becomes a high impedance state with respect to the external circuit. Therefore, the signal from outside applied to the input-output terminal 3 is transmitted to the input buffer 9 without being spoiled.

The operation mode (output mode) for receiving the data input signal IN1 from the internal circuit and converting the signal level of the entered data input signal IN1 will now be explained. This output mode operates when the control signal IN2 becomes L level.

The NMOS transistor MN113 is turned off when it receives the control signal IN2 of L level. The inverter G112 outputs a signal of H level when it receives the control signal IN2 of L level. Therefore, the NMOS transistor MN114 having the gate connected to the output terminal of this inverter G112 is turned on.

As a result, the potential at the node N112 drops to the grounding potential GND, and the PMOS transistor MP113 is turned on. Further, the potential of the drain of the PMOS transistor MP113 raises to the second supply potential VDD2. Therefore, the PMOS transistor MP114 is turned off, and consequently, the node N112 becomes L level.

In this output mode state, when the data input signal IN1 becomes H level, the same as in the input mode mentioned above, the node N111 becomes H level. As a result, a signal of H level of the node N111 is entered in one of the input terminals of the NAND gate G114, and a signal of H level converted to the signal of L level of the node N112 is entered in other input terminal through the inverter G113, so that the node N114, which is the output of the NAND gate G114, becomes L level. Thus, the PMOS transistor MP115 is turned on.

In this case, the H level signal of the node N111 is fed into one input terminal of the NOR gate G115, and the L level signal of the node N112 is fed into other input terminal, so that the output of the NOR gate G115, that is, the node N115, becomes L level. Therefore, the NMOS transistor MN115 is turned off.

When the PMOS transistor MP115 is turned on and the NMOS transistor MN115 is turned off, the potential at the junction of the drain of the PMOS transistor MP115 and the drain of the NMOS transistor MN115 rises to the second supply potential VDD2. Therefore, the data input signal IN1 of H level of the first supply potential VDD1 is issued from the input-output terminal 3 as a signal of H level of the second supply potential VDD2.

In this output mode state, on the other hand, when the data input signal IN1 becomes L level, same as in the above case of input mode, the node N111 becomes L level. As a result, the L level signal of the node N111 is fed into one input terminal of the NAND gate G114, and the H level signal converted from the L level signal of the node N112 through the inverter G113 is fed into other input terminal, so that the node N114 which is the output of the NAND gate G114 becomes H level. Thus, the PMOS transistor MP115 is turned off.

In this case, the L level signal of the node N111 is fed into one input terminal of the NOR gate G115, and the L level signal of the node N112 is fed into other input terminal, and the node N115, which is the output of the NOR gate G115, becomes H level. Thus, the NMOS transistor MN115 is turned on.

When the PMOS transistor MP115 is turned off, and the NMOS transistor MN115 is turned on, the potential at the junction of the drain of the PMOS transistor MP115 and the drain of the NMOS transistor MN115 drops to the grounding potential GND. Therefore, the data input signal IN1 of L level of the internal circuit is output from the input-output terminal 3 as a signal of L level to the external circuit.

However, in such a conventional semiconductor integrated circuit with signal level converting function, so as not to lose the saving effect of power consumption by two power supplies for the signal level converting function of the input-output circuit, it is necessary to add a D type flip-flop circuit. In other words, it is necessary to provide a centralized control and not to disperse the input-output circuit inside the semiconductor circuit.

Therefore, it is necessary to provide a D type flip-flop circuit and connect this D type flip-flop circuit in the prior stage of the input-output circuit, when converting the level of the signal supplied from the internal circuit of the LSI operated by the first power source system (the power source system in which the first supply potential VDD1 and grounding potential GND are supplied), and after a certain time delay, issuing to the circuit outside of the LSI operated by the second power source system (the power source system in which the second supply potential VDD2 and grounding potential GND are supplied).

As explained above, in the conventional art, since the input-output circuit which actually converts the signal level and the D type flip-flop are not designed as independent circuit structures, in the entire semiconductor integrated circuit, the number of elements and their layout are not always efficient. Therefore, it is also a cause of lowering of input and output speed of the signal accompanied by level conversion.

SUMMARY OF THE INVENTION

It is an object of the invention to present a semiconductor integrated circuit for realizing a data delaying function and a signal level converting function using an optimum number of elements and configuration of elements.

According to one aspect of the invention, an input-output circuit which converts the level of the signal supplied from an internal circuit of an LSI operated by a first power source system (the power source system in which a first supply potential and grounding potential are supplied), and, after a certain time delay, issues the signal to a device outside of the LSI operated by a second power source system (the power source system in which the second supply potential and grounding potential are supplied) is composed in the following manner. That is, the input-output circuit is composed by disposing a flip-flop between an input circuit and tri-state type output circuit. Therefore, a first data signal and first control signal issued from the internal circuit can be individually converted in level and delayed.

Further, a first clock signal and/or first set signal of the first power source system for data output control of the flip-flop circuit is also converted in level to the voltage level of the second power source system. Therefore, for controlling the flip-flop circuit in the second power source system, a level-converted second clock signal and/or second set signal can be utilized.

According to another aspect of the invention, an input-output circuit which converts the level of the signal supplied from an internal circuit of an LSI operated by a first power source system (the power source system in which a first supply potential and grounding potential are supplied), and, after a certain time delay, issues the signal to a device outside of the LSI operated by a second power source system (the power source system in which the second supply potential and grounding potential are supplied) is composed in the following manner. That is, the input-output circuit is composed by disposing an input circuit and tri-state type output circuit adjacently to the rear stage of a flip-flop circuit. Therefore, a first data signal and first control signal issued from the internal circuit can be individually converted in level and delayed.

According to still another aspect of the invention, an input-output circuit which converts the level of the signal supplied from an internal circuit of an LSI operated by a first power source system (the power source system in which a first supply potential and grounding potential are supplied), and, after a certain time delay, issues the signal to a device outside of the LSI operated by a second power source system (the power source system in which the second supply potential and grounding potential are supplied) is composed in the following manner. That is, the input-output circuit is composed by disposing a tri-state type output circuit adjacently to the rear stage of a flip-flop circuit. In particular, the flip-flop circuit functions to convert the level in its inside. Therefore, a first data signal and first control signal issued from the internal circuit can be individually converted in level and delayed inside of the flip-flop circuit.

Further, the input-output circuit which converts the level of the signal supplied from the internal circuit of the LSI operated by the first power source system (the power source system in which the first supply potential and grounding potential are supplied), and, after a certain time delay, issues the signal to the device outside of the LSI operated by the second power source system (the power source system in which the second supply potential and grounding potential are supplied) is composed in the following manner. That is, the input-output circuit is composed by disposing the tri-state type output circuit adjacently to the rear stage of the flip-flop circuit. In particular, the flip-flop circuit functions to convert the level in its inside after delaying in a delaying unit. Therefore, the first data signal and first control signal issued from the internal circuit can be individually converted in level and delayed inside of the flip-flop circuit.

Further, the input-output circuit which converts the level of the signal supplied from the internal circuit of the LSI operated by the first power source system (the power source system in which the first supply potential and grounding potential are supplied), and, after a certain time delay, issues the signal to the device outside of the LSI operated by the second power source system (the power source system in which the second supply potential and grounding potential are supplied) is composed in the following manner. That is, the input-output circuit is composed by disposing the tri-state type output circuit adjacently to the rear stage of the flip-flop circuit. In particular, the flip-flop circuit functions to convert the level of the first clock signal as well as the first data signal and first control signal in its inside. Therefore, the first data signal and first control signal issued from the internal circuit can be individually converted in level and delayed, and the second clock signal converted into the level of the second power source system can be utilized in control of the tri-state type output circuit of the second power source system.

Other objects and features of this invention will become apparent from the following description with reference to the accompanying drawings.

BRIEF DESCRIPTION OF THE DRAWINGS

FIG. 6 is a chart showing an operation function table of an output circuit unit in the semiconductor integrated circuit in the second embodiment.

FIG. 11 is a chart showing an operation function table of the output circuit unit in the semiconductor integrated circuit in the fourth embodiment.

DESCRIPTION OF THE PREFERRED EMBODIMENTS

Figure 1:
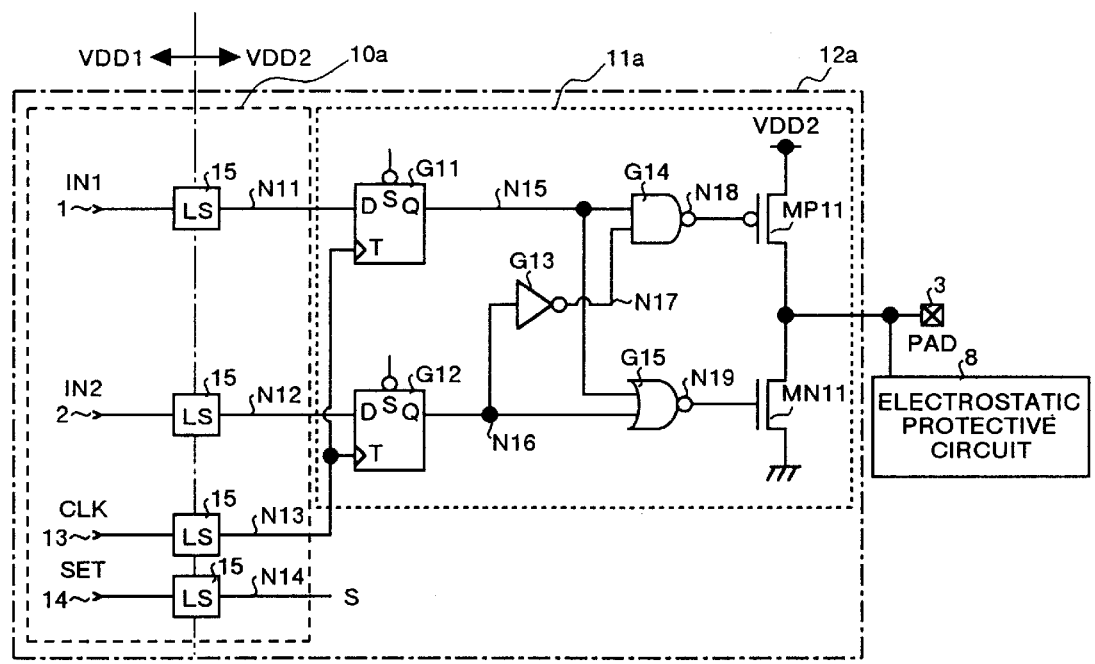
FIG. 1 is a circuit diagram showing a configuration of input-output circuit in a semiconductor integrated circuit in a first embodiment of the invention.

Referring now to the drawings, preferred embodiments of the semiconductor integrated circuit of the invention are explained in detail below. It must be noted, however, that the invention is not limited to these illustrated embodiments alone.

Figure 14:
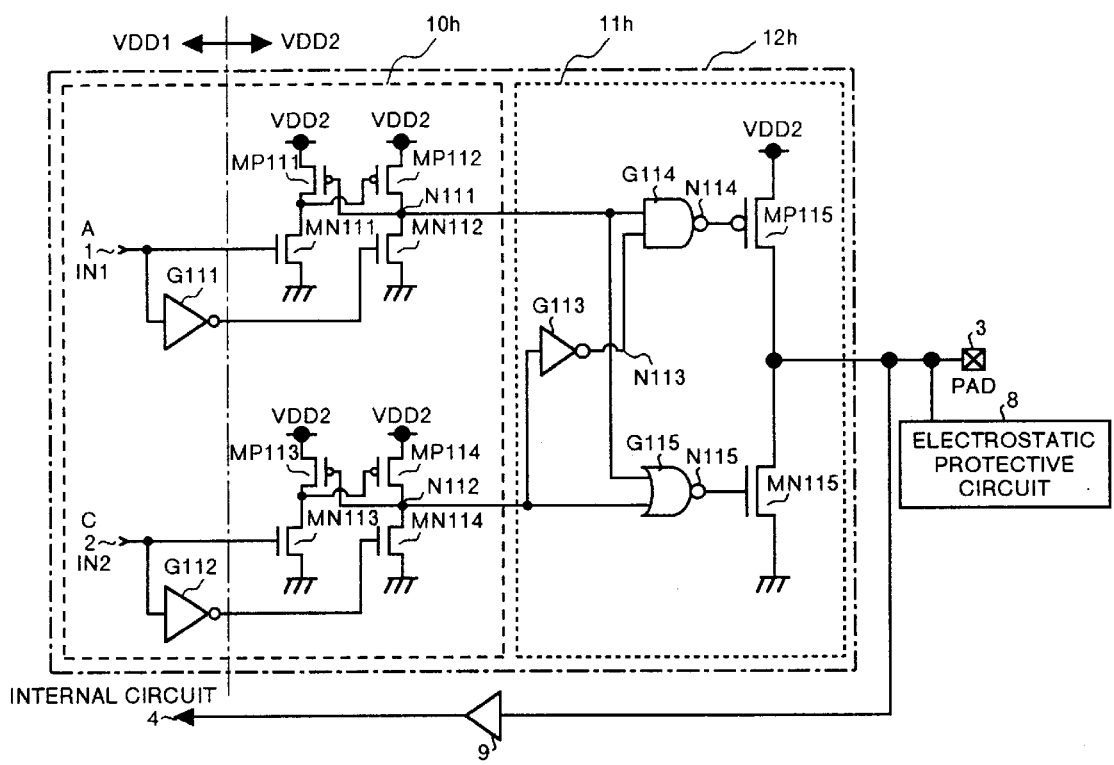
FIG. 14 is a circuit diagram of an input-output circuit in a conventional semiconductor integrated circuit with signal level converting function.

A semiconductor integrated circuit in a first embodiment is explained below. FIG. 1 is a circuit diagram showing a configuration of input-output circuit in a semiconductor integrated circuit in the first embodiment. Same parts as in FIG. 14 are identified with same reference numerals, and their description is omitted.

The input-output circuit shown in FIG. 1 is composed of an output buffer circuit 12a, an electrostatic protective circuit 8, and a not shown input buffer circuit 9. As shown in FIG. 1, the output buffer circuit 12a is composed of an input circuit unit 10a and an output circuit unit 11a. The input circuit unit 10a is divided into a portion which operates at a first supply potential VDD1 and a portion which operates at a second supply potential VDD2, inside of a signal level converting circuit 15. The signal level converting circuit 15 is explained in detail later.

As shown in FIG. 1, the input circuit unit 10a receives four signals from the internal circuit, that is, data input signal IN1, output control signal IN2, clock input signal CLK, and set signal SET, and feeds them sequentially into an input terminal 1, an output control terminal 2, a clock terminal 13, and a set terminal 14. The input circuit unit 10a converts the signal level from first supply potential VDD1 level into second supply potential VDD2 by passing these signal through the signal level converting circuit 15, and outputs the level converted signals to the output circuit unit 11a at the rear stage through nodes N11, N12, N13, and N14, respectively.

In FIG. 1, the symbol "VDD1←" indicates the circuit that operates at the first supply potential VDD1 which is the supply voltage of the internal circuit. On the other hand, and the symbol "→VDD2" indicates the circuit that operates at the second supply potential VDD2. It is assumed here that a relation of VDD2>VDD1>GND holds.

Figures 2, 3:
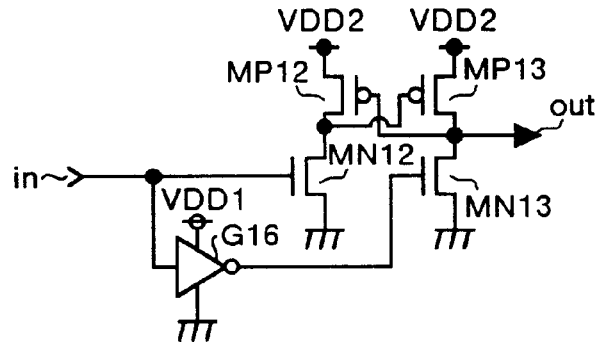
FIG. 2 is a circuit diagram showing a configuration of signal level converting circuit in the semiconductor integrated circuit in the first embodiment.
FIG. 3 is a chart showing an operation function table of a tri-state type output circuit in the semiconductor integrated circuit in the first embodiment.

FIG. 2 shows a detailed configuration of the signal level converting circuit 15. As shown in FIG. 2, the signal level converting circuit 15 comprises an inverter G16, a PMOS transistor MP12, a PMOS transistor MP13, an NMOS transistor MN12, and an NMOS transistor MN13. The inverter G16 has its input terminal connected to an input terminal "in". The PMOS transistor MP12 has its source connected to the second supply potential VDD2 and gate connected to an output terminal "out". The PMOS transistor MP13 has its source connected to the second supply potential VDD2, gate connected to the drain of the PMOS transistor MP12, and drain connected to the output terminal "out". The NMOS transistor MN12 has its source connected to the grounding potential GND, the connected to the input terminal "in", and drain connected to the drain of the PMOS transistor MP12. The NMOS transistor MN13 has its source connected to the grounding potential GND, gate connected to the output terminal of the inverter G16, and drain connected to the output terminal "out".

The inverter G16 corresponds to the portion operated at the first supply potential VDD1, and the structure of the PMOS transistors MP12 and MP13 and NMOS transistors MN12 and MN13 corresponds to the portion operated by the second supply potential VDD2.

Thus, the signal level converting circuit 15 has a configuration so that the NMOS transistors MN12 and MN13 and the inverter G16 may form mutually complementary N channel logic units (while one is conducting, other is not conducting), and by combining these NMOS transistors and the cross-coupled PMOS transistors MP12 and MP13, a CMOS circuit free from direct-current pass between the second supply potential VDD2 and the grounding potential GND is composed.

In other words, the signal level converting circuit 15 is a latch type signal level converting circuit which converts the signal of first supply potential VDD1 level from the LSI internal circuit entered through the input terminal "in", into a signal of second supply potential VDD2 level, and the signal after signal level conversion is sent out into the output terminal "out".

Returning to FIG. 1, the output circuit unit 11a has a delay circuit disposed at its front stage, and a tri-state type output circuit disposed at its rear stage. The delay circuit and tri-state type output circuit operate on the second supply potential VDD2.

The delay circuit is composed of a D type flip-flop G11 having input data terminal D, output data terminal Q, clock input terminal T, and set input terminal S connected to node N11, node N15, node N13, and node N14 respectively, and a D type flip-flop G12 having input data terminal D, output data terminal Q, clock input terminal T, and set input terminal S connected to node N12, node N16, node N13, and node N14 respectively.

The tri-state type output circuit is composed of an inverter G13, a two-input NAND gate G14, a two-input NOR gate G15, a PMOS transistor MP11, and an NMOS transistor MN11. The inverter G13 has its input terminal connected to a node N16. The two-input NAND gate G14 has one of its input terminal connected to a node N15 and the other input terminal connected to the output terminal of the inverter G13. The two-input NOR gate G15 has one of its input terminal connected to the node N15, and the other input terminal connected to the node N16. The PMOS transistor MP11 has its source connected to the second supply potential VDD2, gate connected to the output terminal of the NAND gate G14 through a node N18, and drain connected to the input-output terminal 3. The NMOS transistor MN11 has its source connected to the grounding potential GND, gate connected to the output terminal of the NOR gate G15 through a node N19, and drain connected to the input-output terminal 3.

The operation of the semiconductor integrated circuit of the first embodiment having such configuration is explained below while referring to FIG. 1 and FIG. 2. The semiconductor integrated circuit according to the first embodiment converts the signal level, then holds the data by a clock signal, or outputs the data by a clock signal, and transmits a signal from an LSI internal circuit to an LSI external circuit. In outer words, this semiconductor integrated circuit converts the level of the signal supplied from the internal circuit of the LSI operated by the first power source system in which the first supply potential VDD1 and grounding potential GND are supplied, after a certain time delay, and supplies the level converted signal to the external circuit of the LSI operated by the second power source system in which the second supply potential VDD2 and grounding potential GND are supplied.

To begin with, the operation of the signal level converting circuit 15 shown in FIG. 2 will be explained. In the signal level converting circuit 15, if the signal entered in the input terminal "in" is L level, the NMOS transistor MN12 is turned off. A signal of H level is fed into the gate of the NMOS transistor MN13 through the inverter G16, because of which the NMOS transistor MN13 is turned on. Therefore, the potential at the output terminal "out" connected to the drain of the NMOS transistor MN13 drops to the grounding potential GND.

Accordingly, the PMOS transistor MP12 having the gate connected to the drain of the NMOS transistor MN13 is turned on, and the PMOS transistor MP13 having the gate connected to the drain of the PMOS transistor MP12 is turned off as a signal of H level is fed into its gate. consequently, a signal of L level is output from the output terminal "out".

Therefore, when the data input signal IN1, output control signal IN2, clock input signal CLK, and set signal SET issued from the internal circuit operated by the first supply potential VDD1 are all entered at L level, then the input circuit unit 10a outputs signals of L level to the nodes N11, N12, N13, and N14 respectively.

On the other hand, in the signal level converting circuit 15, when the signal entered in the input terminal "in" is at H level, the NMOS transistor MN12 is turned on, and the output of the inverter G16 is at L level. Therefore, the NMOS transistor MN13 is turned off. As a result, signal of L level is input into the gate of the PMOS transistor MP13 connected to the drain of the NMOS transistor MN12. Therefore, the potential at the output terminal "out" connected to the drain of the NMOS transistor MN13 raises to the second supply potential VDD2.

Consequently, the PMOS transistor MP12 of which gate is connected to the drain of the NMOS transistor MN13 is turned off, so that a signal of H level is output from the output terminal "out".

Therefore, when the data input signal IN1, output control signal IN2, clock input signal CLK, and set signal SET issued from the internal circuit operated by the first supply potential VDD1 are all entered at H level, then the input circuit unit 10a outputs signals of H level of the second supply potential VDD2 from the nodes N11, N12, N13, and N14 respectively.

As explained above, in the signal level converting circuit 15, since the CMOS circuit free from direct-current pass between the second supply potential VDD2 and grounding potential GND, the signal level can be converted from the first supply potential VDD1 to the second supply potential VDD2.

In the output circuit unit 11a, as shown in FIG. 1, first in the D type flip-flops G11 and G12 which compose the delaying circuit, the level converting result (the signal on the node N13) issued from the signal level converting circuit 15 to the clock input signal CLK is entered as clock signal into the clock input terminal T.

In particular, the D type flip-flops G11 and G12 take in and hold temporarily the input data at the input data terminal D at the edge of the entered clock signal, and issue the held data from the data input terminal Q at the edge of next clock signal. Therefore, the D type flip-flops G11 and G12 operate to issue the data by delaying for the portion of one period of the clock signal, which is known as the operation of D type flip-flop.

In FIG. 1, the level conversion result (the signal on the node N14) issued from the signal level converting circuit 15 to the set signal SET is fed into the set input terminals S of the D type flip-flops G11 and G12, and the flip-flop internal state is directly changed to the set state depending on the level (that is, the state in which the signal issued from the output data terminal Q is at H level).

The operation of the tri-state type output circuit in the output circuit unit 11a will be explained here. FIG. 3 is a chart showing the operation control table of this tri-state type output circuit. It is assumed that the output buffer circuit 12a is in output mode when the output control signal IN2 is at L level, and in input mode when the output control signal IN2 at is at H level.

A shown in FIG. 1 and FIG. 3, when the set signal SET is H level and output control signal IN2 is L level, after the operation of D type flip-flop of taking in, holding and outputting data at the leading edge of the clock signal, data input signal IN1 is issued to the node N15, and L level signal to the node N16.

In this state, when the data input signal IN1 is at H level, a signal of H level is fed into one input terminal (node N15) of the NAND gate G14, and a signal of H level is fed into other input terminal (node N17) of the NAND gate G14 through the inverter G13, and therefore a signal of L level is issued from the output terminal (node N18) of the NAND gate G14.

Further, a signal of H level is fed to one input terminal (node N15) of the NOR gate G15, and a signal of L level is fed into other input terminal (node N16) of the NOR gate G15, and therefore a signal of L level is issued from the output terminal (node N19) of the NOR gate G15.

Therefore, when the set signal SET is at H level, the output control signal IN2 is at L level, and the data input signal IN1 is at H level, the PMOS transistor MP11 is turned on, and the NMOS transistor MN11 is turned off, and a signal of H level is issued to the input-output terminal 3. It means that the output buffer circuit 12a operates in output mode, and that the signal of H level specified by the first supply potential VDD1 is converted in level into a signal of H level defined by the second supply potential VDD2 and is issued from the input-output terminal 3.

On the other hand, when the data input signal IN1 is at L level, a signal of L level is fed into one input terminal (node N15) of the NAND gate G14, and a signal of H level is fed into other input terminal (node N17) of the NAND gate G14 through the inverter G13. Therefore, a signal of H level is issued from the output terminal (node N18) of the NAND gate G14.

A signal of L level is fed into one input terminal (node N15) of the NOR gate G15, and a signal of L level is fed into other input terminal (node N16) of the NOR gate G15. Therefore, a signal of H level is issued from the output terminal (node N19) of the NOR gate G15.

Therefore, the PMOS transistor MP11 is turned off, and the NMOS transistor MN11 is turned on, and a signal of L level is issued to the input-output terminal 3. It means that the output buffer circuit 12a operates in output mode, and that the signal of L level specified by the first supply potential VDD1 is issued from the input-output terminal 3 as the signal of L level specified by the second supply potential VDD2.

When the set signal SET is at H level and the output control signal IN2 is at H level, after the operation of the D type flip-flop operation of taking in the data at the leading edge of the clock signal, holding and issuing, the data input signal IN1 is issued to the node N15 and a signal of H level to the node N16.

In this state, whether the data input signal IN1 is at H level or at L level, since a signal of L level is fed into one input terminal (node N17) of the NAND gate G14 through the inverter G13, a signal of H level is issued from the output terminal (node N18) of the NAND gate G14. Further, since a signal of H level is fed into one input terminal (node N16) of the NOR gate G15, a signal of L level is issued from the output terminal (node N19) of the NOR gate G15.

Therefore, when the set signal SET is at H level and the output control signal IN2 is at H level, regardless of the level of the data input signal IN1, both PMOS transistor PM11 and NMOS transistor MN11 are turned off, and the output buffer circuit 12a is in high impedance state with respect to the input-output terminal 3. It means that the output buffer circuit 12a operates in input mode.

On the other hand, when the set signal SET is at L level, regardless of the level of the data input signal IN1, output control signal IN2 and clock input signal CLK, signals of H level are issued from the output data terminal Q of D type flip-flops G11 and G12. Therefore, same as in the case of H level of the output control signal IN2, both PMOS transistor MP11 and NMOS transistor MN11 are turned off, and the output buffer circuit 12a is in high impedance state with respect to the input-output terminal 3.

As explained above, according to the semiconductor integrated circuit of the first embodiment, the output buffer circuit 12a which converts the level of the signal supplied from the internal circuit of the LSI operated by the first power source system (the power source system in which the first supply potential VDD1 and grounding potential GND are supplied), and, after a certain time delay, issues the signal to the device outside of the LSI operated by the second power source system (the power source system in which the second supply potential VDD2 and grounding potential GND are supplied) is composed by disposing a D type flip-flop between the signal level converting circuit 15 and tri-state type output circuit. Therefore, the input signal IN1 and output control signal IN2 issued from the internal circuit can be individually converted in level and delayed. Further, the route of these signals until being issued to the external circuit is always appropriate in length, and the data signal propagation delay time of the output buffer circuit 12a can be shortened. Furthermore, as compared with the conventional semiconductor integrated circuit with signal level converting function, the number of elements required for configuration can be curtailed.

Figure 4:
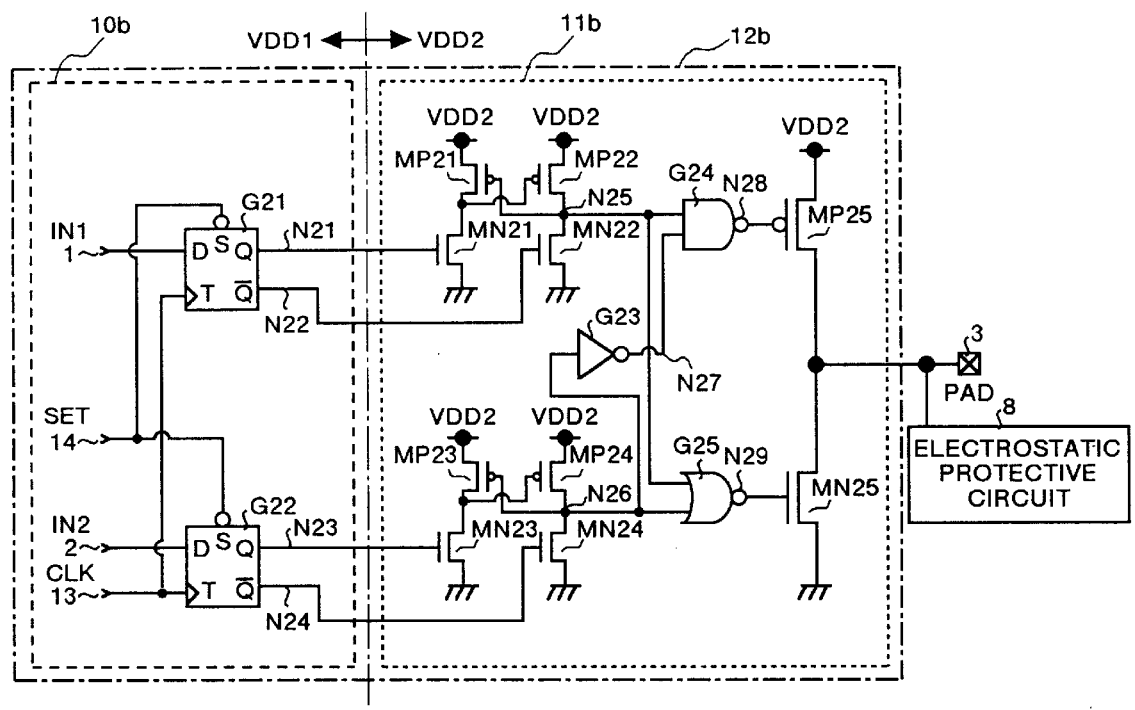
FIG. 4 is a circuit diagram showing a configuration of input-output circuit in a semiconductor integrated circuit in a second embodiment of the invention.

A semiconductor integrated circuit in a second embodiment is now explained below. FIG. 4 is a circuit diagram showing a configuration of the input-output circuit in a semiconductor integrated circuit in the second embodiment. Same parts as in FIG. 1 are identified with same reference numerals, and their description is omitted.

The input-output circuit shown in FIG. 4 is composed of an output buffer circuit 12b, the electrostatic protective circuit 8, and a not shown input buffer circuit 9. In FIG. 4, the output buffer circuit 12b is composed of an input circuit unit 10b and an output circuit unit 11b.

In FIG. 4, the symbol "VDD1←" indicates the circuit that operates at the first supply potential VDD1 which is the supply voltage of the internal circuit. On the other hand, and the symbol "→VDD2" indicates the circuit that operates at the second supply potential VDD2. It is assumed here that a relation of VDD2>VDD1>GND holds.

As shown in FIG. 4, the input circuit unit 10b has two signal routes, input signal IN1 from internal circuit and output control signal IN2. D type flip-flops G21 and G22 are disposed in these signal routes respectively. The input circuit unit 10b controls the output of the D type flip-flops G21 and G22 based on the clock input signal CLK and set signal SET, and outputs the output to the output circuit unit 11b at the rear stage through nodes N21, N22, N23 and N24.

As shown in FIG. 4, the D type flip-flop G21 has input data terminal D, output data terminal Q, reverse phase output data terminal /Q, clock input terminal T, and set input terminal S sequentially connected to the input terminal 1, the node N21, node N22, clock terminal 13, and set terminal 14, and the D type flip-flop G22 has input data terminal D, output data terminal Q, reverse phase output data terminal /Q, clock input terminal T, and set input terminal S sequentially connected to the output control terminal 2, the node N23, node N24, clock terminal 13, and set terminal 14.

Figure 5A:
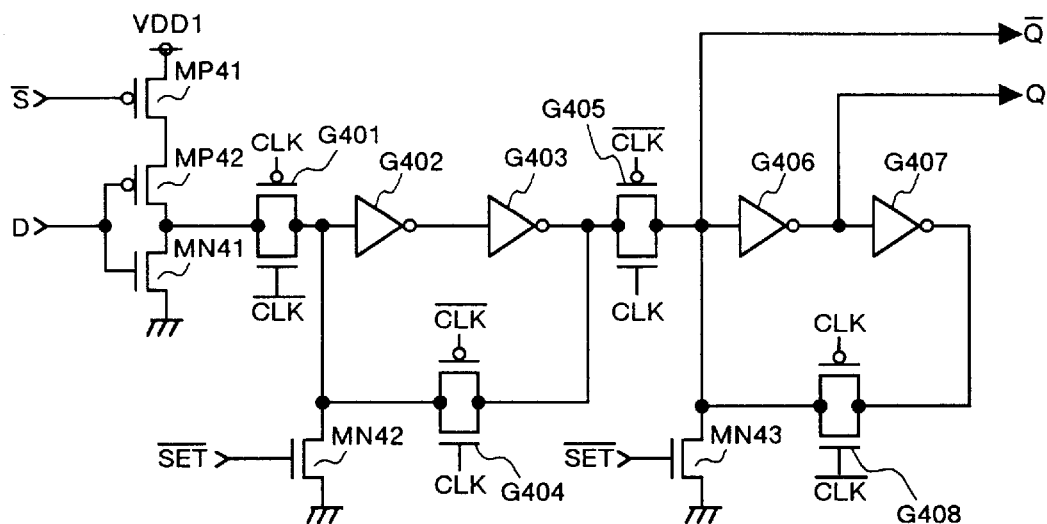
FIG. 5A to FIG. 5C are circuit diagrams showing a configuration of a D type flip-flop in the semiconductor integrated circuit in the second embodiment.
Figure 5B:
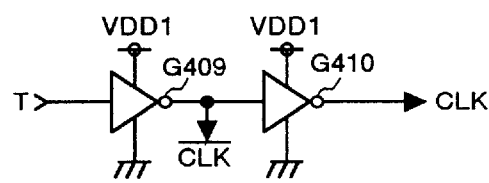
Figure 5C:
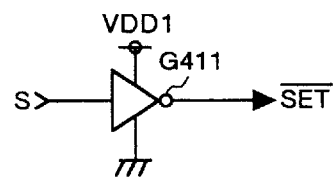

FIG. 5A to FIG. 5C show a detailed configuration of the D type flip-flops G21 and G22. As shown in FIG. 5A, the D type flip-flop G21 (the D type flip-flop G22 has the same structure) is composed of a PMOS transistor MP41 having the source connected to the first supply potential VDD1 and the gate connected to the reverse phase set terminal /S. There is also a PMOS transistor MP42 having the source connected to the drain of the PMOS transistor MP41 and the gate connected to the input data terminal D. There is also an NMOS transistor MN41 having the source connected to the grounding potential GND, the gate connected to the input data terminal D, and the drain connected to the drain of the PMOS transistor MP42. There is also a transmission gate G401 having the first contact terminal connected to the drain of the NMOS transistor MN41 which receives a clock input signal CLK at the gate of the PMOS transistor and receiving a reverse phase clock input signal /CLK at the gate of the NMOS transistor. There is also an inverter G402 having the input terminal connected to the second contact terminal of the transmission gate G401, and an inverter G403 having the input terminal connected to the output terminal of the inverter G402. There is also a transmission gate G404 having the first contact terminal connected to the second contact terminal of the transmission gate G401 and the second contact terminal connected to the output terminal of the inverter G403 which receives a reverse phase clock input signal /CLK at the gate of the PMOS transistor and receiving a clock input signal CLK at the gate of the NMOS transistor. There is also an NMOS transistor MN42 having the drain connected to the second contact terminal of the transmission gate G401 which receives a reverse phase set signal/SET at the gate, and having the source connected to the grounding potential GND. There is also a transmission gate G405 having the first contact terminal connected to the output terminal of the inverter G403 and the second contact terminal connected to the reverse phase data terminal /Q which receives a reverse phase clock input signal /CLK at the gate of the PMOS transistor and receiving a clock input signal CLK at the gate of the NMOS transistor. There is also an inverter G406 having the input terminal connected to the second contact terminal of the transmission gate G405 and the output terminal connected to the output data terminal Q, and an inverter G407 having the input terminal connected to the output terminal of the inverter G406. There is also a transmission gate G408 having the first contact terminal connected to the second contact terminal of the transmission gate G405 and the second contact terminal connected to the output terminal of the inverter G407 which receives a reverse phase clock input signal /CLK at the gate of the PMOS transistor and receiving a clock input signal CLK at the gage of the NMOS transistor. There is also and an NMOS transistor MN43 having the drain connected to the second contact terminal of the transmission gate G405 which receives a reverse phase set signal/SET at the gate and having the source connected to the grounding terminal GND.

The reverse phase clock input signal /CLK is obtained, as shown in FIG. 5B, from the output terminal of an inverter G409 having the input terminal connected to the clock input terminal T, and the clock input signal CLK is obtained from the output terminal of an inverter G410 having the input terminal connected to the output terminal of the inverter G409. The constitution shown in FIG. 5B is also a section of the constitution of the D type flip-flops G21 and G22.

Further, the reverse phase set signal/SET is, as shown in FIG. 5C, obtained from the output terminal of an inverter G411 having the input terminal connected to the set input terminal S. The constitution shown in FIG. 5C is also part of the constitution of the D type flip-flops G21 and G22. These D type flip-flops G21 and G22 shown in FIG. 5A to FIG. 5C operate on the first supply potential VDD1.

The output circuit unit 11b is divided, at its front stage as shown in FIG. 4, into a portion which processes signals issued to the nodes N21 and N22 of the input circuit unit 10b, that is, signals corresponding to the data input signal IN1 (hereinafter called a first signal processing unit), and a portion which processes signals issued to the nodes N23 and N24 of the input circuit unit 10b, that is, signals corresponding to the output control signal IN2 (hereinafter called a second signal processing unit).

The first signal processing unit is composed of a PMOS transistor MP21, an NMOS transistor MN21, a PMOS transistor MP22, and an NMOS transistor MN22. The PMOS transistor MP21 has its source connected to the second supply potential VDD2. The NMOS transistor MN21 has its source connected to the grounding potential GND, drain connected to the drain of the PMOS transistor MP21, and gate connected to the node N21. The PMOS transistor MP22 has its source connected to the second supply potential VDD2 and the gate connected to the drain of the NMOS transistor MN21. The NMOS transistor MN22 has its drain connected to the gate of the PMOS transistor MP21 and to the drain of the PMOS transistor MP22.

The point at which the gate of the PMOS transistor MP21, the drain of the PMOS transistor MP22, and the drain of the NMOS transistor MN22 will be referred to as a node N25. Thus, the first signal processing portion is a circuit which converts the signal at the first supply potential VDD1 level issued to the nodes N21 and N22 of the input circuit unit 10b into a signal at the second supply potential VDD2 level, and transmitting into the node N25.

On the other hand, the second signal processing unit is composed of a PMOS transistor MP23, an NMOS transistor MN23, a PMOS transistor MP24, and an NMOS transistor MN24. The PMOS transistor MP23 has its source connected to the second supply potential VDD2. The NMOS transistor MN23 has its source connected to the grounding potential GND, drain connected to the drain of the PMOS transistor MP23, and gate connected to the node N23. The PMOS transistor MP24 has its source connected to the second supply potential VDD2 and gate connected to the drain of the NMOS transistor MN23. The NMOS transistor MN24 has its drain connected to the gate of the PMOS transistor MP23 and to the drain of the PMOS transistor MP24.

The point at which the gate of the PMOS transistor MP23, the drain of the PMOS transistor MP24, and the drain of the NMOS transistor MN24 will be referred to as a node N26. Thus, the second signal processing portion is a circuit which converts the signal at the first supply potential VDD1 level issued to the nodes N23 and N24 of the input circuit unit 10b into a signal at the second supply potential VDD2 level, and transmitting into the node N26.

At its rear stage, the output circuit unit 11b is composed of, as shown in FIG. 4, an inverter G23 having the input terminal connected to the node N26, a two-input NAND gate G24 having one input terminal connected to the node N25 and other input terminal connected to the output terminal of the inverter G23, a two-input NOR gate G25 having one input terminal connected to the node N25 and other input terminal connected to the node N26, a PMOS transistor MP25 having the source connected to the second supply potential VDD2 and the gate connected to the output terminal (node N28) of the NAND gate G24, and an NMOS transistor MN25 having the drain connected to the drain of the PMOS transistor MP25, the source connected to the grounding potential GND, and the gate connected to the output terminal (node N29) of the NOR gate 25.

The operation of the semiconductor integrated circuit in the second embodiment having such configuration is explained below while referring to FIG. 4. The semiconductor integrated circuit of the second embodiment operates in the same manner as in the first embodiment. That is, it converts the level of the signal supplied from the internal circuit of the LSI operated by the first power source system in which the first supply potential VDD1 and grounding potential GND are supplied, delays by a specific time, and supplies into an external circuit of the LSI operated by the second power source system in which the second supply potential VDD2 and grounding potential GND are supplied.

The input circuit unit 10b receives output data signal IN1, output control signal IN2, clock input signal CLK, and set signal SET from the internal circuit, and issues them into the nodes N21, N22, N23, and N24 through D type flip-flops G21 and G22. The D type flip-flops G21 and G22 take in the input data at the edge of the clock input signal CLK, hold temporarily, and issue the data at the edge of the clock input signal CLK. By delay of one period of clock input signal CLK, the signal is issued to the output data terminal Q, which is known as D type flip-flop operation. The set signal SET is an input signal which sets the flip-flop internal state directly in set state (the state in which the signal issued from the output data terminal Q is at H level).

The operation of the output circuit unit 11b will now be explained. FIG. 6 is a chart of operation function table of this output circuit unit 11b. The output buffer circuit 12b is supposed to be in the output mode when the output control signal IN2 is at L level, and it is supposed to be in the input mode when the output control signal IN2 is at H level.

In FIG. 4, when the set signal SET is at H level and the output control signal IN2 is at L level, after the D type flip-flop operation of taking in the data at the leading edge of the clock signal, and holding and issuing, the data input signal IN1, reverse phase signal of data input signal IN1, L level signal, and H level signal are issued to the node N21, node N22, node N23, and node N24 respectively.

Therefore, when the L level signal is issued to the node N23 and the H level signal is issued to the node N24, the NMOS transistor MN23 is turned off, and the NMOS transistor MN24 is turned on.

Consequently, the potential at the node N26 drops to the grounding potential GND, and the PMOS transistor MP23 is turned on, and the potential at the drain of the PMOS transistor MP23 raises to the second supply potential VDD2. Therefore, the PMOS transistor MP24 is turned off, and the node N26 becomes L level.

In this state, when the data input signal IN1 becomes H level, a signal of H level is issued to the output data terminal Q of the D type flip-flop G21, that is, at the node N21, and a signal of L level is issued to the reverse phase output data terminal /Q of the D type flip-flop G21, that is, at the node N22. Therefore, the NMOS transistor MN21 is turned on, the potential at the drain of the NMOS transistor MN21 drops to the grounding potential GND, and the PMOS transistor MP22 of which gate is connected to its drain is turned on. At the same time, the NMOS transistor MN22 is turned off.

As the PMOS transistor MP22 is turned on, the potential at the node N25 raises to the second supply potential VDD2, and hence the PMOS transistor MP21 is turned off. Thus, the node N25 becomes H level.

Consequently, the H level signal of the node N25 is fed into one input terminal of the NAND gate G24, and a signal of H level converted from the L level signal at the node N26 is fed into other input terminal through the inverter G23. Therefore, the node N28 which is the output of the NAND gate G24 becomes L level. Thus, the PMOS transistor MP25 is turned on.

In this case, since the H level signal at the node N25 is fed into one input terminal of the NOR gate G25, and the L level signal at the node N26 is fed into other input terminal, the node N29 which is the output of the NOR gate G25 is at L level. Thus, the NMOS transistor MN25 is turned off.

In this manner, as the PMOS transistor MP25 is turned on and the NMOS transistor MN25 is turned off, the potential at the point where the drain of the PMOS transistor MP25 and the drain of the NMOS transistor MN25 are connected raises to the second supply potential VDD2. Thus, the data input signal IN1 at H level of first supply potential VDD1 is issued from the input-output terminal 3 as a signal at H level of second supply potential VDD2.

On the other hand, in this output mode state, when the data input signal IN1 becomes L level, a signal of L level is issued to the output data terminal Q of the D type flip-flop G21, that is, at node N21, whereas a signal of H level is issued to the reverse phase output data terminal /Q of the D type flip-flop G21, that is, at node N22. Consequently, the NMOS transistor MN21 is turned off, and the NMOS transistor MN22 is turned on.

Therefore, the potential at the node N25 drops to the grounding potential GND, and the PMOS transistor MP21 is turned on, so that the potential at the drain of the PMOS transistor MP21 raises to the second supply potential VDD2. Accordingly, the PMOS transistor MP22 is turned off, and the node N25 becomes L level.

Consequently, the L level signal of node N25 is fed into one input terminal of the NAND gate G24, and a signal of H level converted from the L level signal at node N26 is fed into other input terminal through the inverter G23, and therefore the node N28 which is the output of the NAND gate G24 becomes H level. Thus, the PMOS transistor MP25 is turned off.

In this case, since the L level signal of node N25 is fed into one input terminal of the NOR gate G25 and the L level signal of node N26 is fed into other input terminal, the node N25 which is the output of the NOR gate G25 becomes H level. Thus, the NMOS transistor MN25 is turned on.

In this manner, as the PMOS transistor MP25 is turned off and the NMOS transistor MN25 is turned on, the potential at the point where the drain of the PMOS transistor MP25 and the drain of the NMOS transistor MN25 are connected drops to the grounding potential GND. Thus, the data input signal IN1 at L level of the internal circuit is also issued as L level signal in the external circuit from the input-output terminal 3.

When the set signal SET is at H level and the output control signal IN2 is at H level, after the D type flip-flop operation of taking in the data at the leading edge of the clock signal, and holding and issuing, the data input signal IN1, reverse phase signal of data input signal IN1, H level signal, and L level signal are issued to the node N21, node N22, node N23, and node N24 respectively.

When the H level signal is issued to the node N23 and the L level signal is issued to the node N24, the NMOS transistor MN23 is turned on, the potential at the drain of the NMOS transistor MN23 drops to the grounding potential GND, and the PMOS transistor MP24 of which gate is connected to its drain is turned on. Thus, the NMOS transistor MN24 is turned off.

The potential at the node N26 raises to the second supply potential VDD2 as the PMOS transistor MP24 is turned on, and the PMOS transistor MP23 is turned off. Thus, the node N26 becomes H level.

In this state, when the data input signal IN1 becomes H level, same as in the above case of the output mode, in the case the node N25 becomes H level and the data input signal IN1 is L level, the node N25 is at L level same as in the case of the output mode above, but in this state, whether the node N25 is at H level or at L level, since L level is fed into one input terminal (node N27) of the NAND gate G24 through the inverter G23, a signal of H level is issued from the output terminal (node N28) of the NAND gate G24. Further, since H level is fed into one input terminal (node N26) of the NOR gate G25, a signal of L level is issued from the output terminal (node N29) of the NOR gate G25.

Therefore, when the set signal SET is at H level and the output control signal IN2 is at H level, regardless of the level of the data input signal IN1, both PMOS transistor MP25 and NMOS transistor MN25 are turned off, and the output buffer circuit 12b is at higher impedance as compared with the input-output terminal 3. It means that the output buffer circuit 12b operates in input mode.

When the set signal SET is at L level, regardless of the level state of the data input signal IN1, output control signal IN2, and clock input signal CLK, signals of H level are issued from the output data terminals Q of the D type flip-flops G21 and G22, and signals of L level are issued from the reverse phase output data terminals /Q. Accordingly, same as when the output control signal IN2 is at H level, both PMOS transistor MP25 and NMOS transistor MN25 are turned off, and the output buffer circuit 12b is at higher impedance as compared with the input-output terminal 3.

As explained above, according to the semiconductor integrated circuit of the second embodiment, the output buffer circuit 12b which converts the level of the signal supplied from the internal circuit of the LSI operated by the first power source system (the power source system in which the first supply potential VDD1 and grounding potential GND are supplied), and, after a certain time delay, issues the signal to the device outside of the LSI operated by the second power source system (the power source system in which the second supply potential VDD2 and grounding potential GND are supplied) is composed by disposing the signal level converting circuit 15 and tri-state type output circuit adjacently to the rear stage of the D type flip-flops. Therefore, the input signal IN1 and output control signal IN2 issued from the internal circuit can be individually converted in level and delayed. Further, the route of these signals until being issued to the external circuit is always appropriate in length, and the data signal propagation delay time of the output buffer circuit 12b can be shortened. Furthermore, as compared with the conventional semiconductor integrated circuit with signal level converting function, the number of elements required for configuration can be curtailed.

Figure 7:
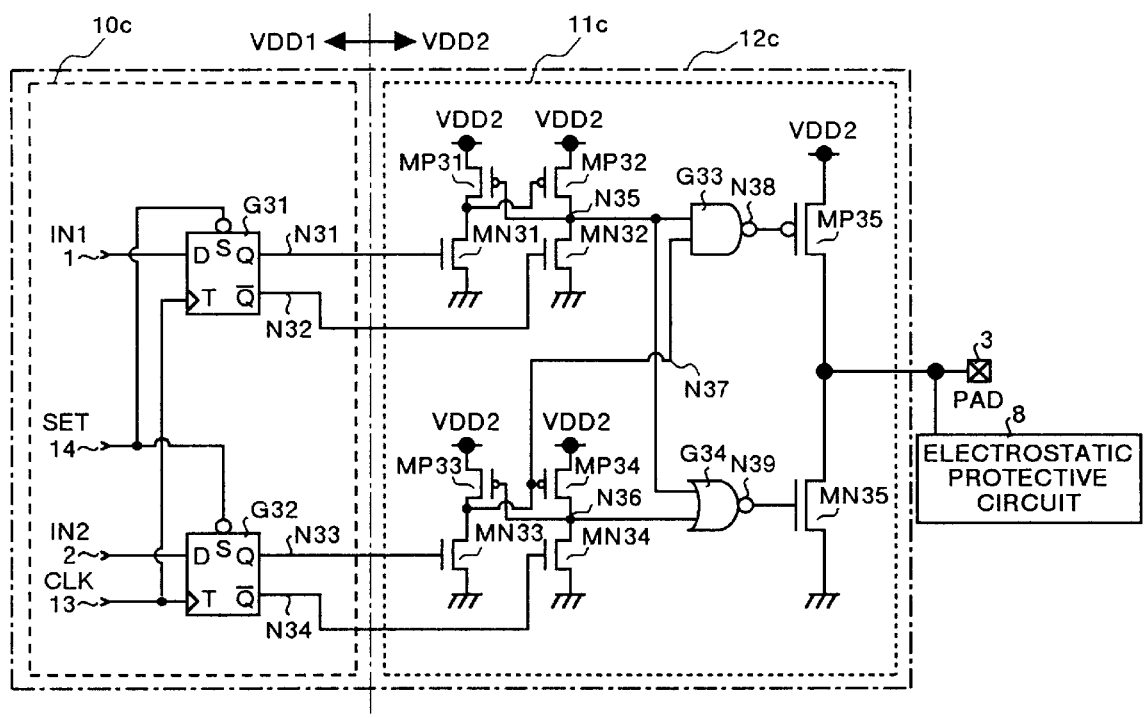
FIG. 7 is a circuit diagram showing a configuration of output circuit unit in a semiconductor integrated circuit in a third embodiment of the invention.

A semiconductor integrated circuit in a third embodiment will now be explained below. FIG. 7 is a circuit diagram showing a configuration of output circuit unit in a semiconductor integrated circuit in the third embodiment. Same parts as in FIG. 1 are identified with same reference numerals, and their description is omitted.

The input-output circuit shown in FIG. 7 is composed of an output buffer circuit 12c, the electrostatic protective circuit 8, and a not shown input buffer circuit 9. As shown in FIG. 7, the output buffer circuit 12c is composed of an input circuit unit 10c and an output circuit unit 11c.

In FIG. 7, the symbol "VDD1←" indicates the circuit that operates at the first supply potential VDD1 which is the supply voltage of the internal circuit. On the other hand, and the symbol "→VDD2" indicates the circuit that operates at the second supply potential VDD2. It is assumed here that a relation of VDD2>VDD1>GND holds.

As shown in FIG. 7, the input circuit unit 10c has two signal routes, input signal IN1 from internal circuit and output control signal IN2. D type flip-flops G31 and G32 are disposed in these signal routes respectively. The input circuit unit 10b controls the output of the D type flip-flops G31 and G32 based on the clock input signal CLK and set signal SET, and outputs the output to the output circuit unit 11c at the rear stage through nodes N31, N32, N33 and N34.

As shown in FIG. 7, the D type flip-flop G31 has input data terminal D, output data terminal Q, reverse phase output data terminal /Q, clock input terminal T, and set input terminal S sequentially connected to the input terminal 1, the node N31, node N32, clock terminal 13, and set terminal 14, and the D type flip-flop G32 has input data terminal D, output data terminal Q, reverse phase output data terminal /Q, clock input terminal T, and set input terminal S connected to the output control terminal 2, the node N33, node N34, clock terminal 13, and set terminal 14 respectively.

The D type flip-flops G31 and G32 have the same structure as the D type flip-flops G21 and G21 shown in FIG. 5A to FIG. 5C explained with reference to the second embodiment, therefore, explanation of their structure will be omitted.

The output circuit unit 11c is divided, at its front stage as shown in FIG. 7, into a portion which processes signals issued to the nodes N31 and N32 of the input circuit unit 10c, that is, signals corresponding to the data input signal IN1 (hereinafter called a first signal processing unit), and a portion which processes signals issued to the nodes N33 and N34 of the input circuit unit 10c, that is, signals corresponding to the output control signal IN2 (hereinafter called a second signal processing unit).

The first signal processing unit is composed of a PMOS transistor MP31, an NMOS transistor MN31, a PMOS transistor MP32, and an NMOS transistor MN32. The PMOS transistor MP31 has its source connected to the second supply potential VDD2. The NMOS transistor MN31 has its source connected to the grounding potential GND, drain connected to the drain of the PMOS transistor MP31, and gate connected to the node N31. The PMOS transistor MP32 has its source connected to the second supply potential VDD2 and gate connected to the drain of the NMOS transistor MN31. The NMOS transistor MN32 has its drain connected to the gate of the PMOS transistor MP31 and to the drain of the PMOS transistor MP32.

The point at which the gate of the PMOS transistor MP31, drain of PMOS transistor MP32, and drain of NMOS transistor MN32 are connected will be referred to as a node N35. Thus, the first signal processing portion is a circuit which converts the signal at the first supply potential VDD1 level issued to the nodes N31 and N32 of the input circuit unit 10c into a signal at the second supply potential VDD2 level, and transmitting into the node N35.

On the other hand, the second signal processing unit is composed of a PMOS transistor MP33, an NMOS transistor MN33, a PMOS transistor MP34, and an NMOS transistor MN34. The PMOS transistor MP33 has its source connected to the second supply potential VDD2. The NMOS transistor MN33 has its source connected to the grounding potential GND, drain connected to the drain of the PMOS transistor MP33, and gate connected to the node N33. The PMOS transistor MP34 has its source connected to the second supply potential VDD2 and gate connected to the drain of the NMOS transistor MN33. The NMOS transistor MN34 has its drain connected to the gate of the PMOS transistor MP33 and to the drain of the PMOS transistor MP34.

The point at which the gate of the PMOS transistor MP33, drain of PMOS transistor MP34, and drain of NMOS transistor MN34 are connected will be referred to as a node N36. Thus, the second signal processing portion is a circuit which converts the signal at the first supply potential VDD1 level issued to the nodes N33 and N34 of the input circuit unit 10c into a signal at the second supply potential VDD2 level, and transmitting into the node N36.

At its rear stage, the output circuit unit 11c is composed of, as shown in FIG. 7, a two-input NAND gate G33, a two-input NOR gate G34, a PMOS transistor MP35, and an NMOS transistor MN35. The two-input NAND gate G33 has one of its input terminal connected to the node N35 and the other input terminal connected to the drain of the NMOS transistor MN33. The two-input NOR gate G34 has one of its input terminal connected to the node N35 and the other input terminal connected to the node N36. The PMOS transistor MP35 has its source connected to the second supply potential VDD2 and gate connected to the output terminal (node N38) of the NAND gate G33. The NMOS transistor MN35 has its drain connected to the drain of the PMOS transistor MP35, source connected to the grounding potential GND, and gate connected to the output terminal (node N39) of the NOR gate G34.

The operation of the semiconductor integrated circuit in the third embodiment having such configuration is explained below while referring to FIG. 7. The semiconductor integrated circuit of the third embodiment operates in the same manner as in the first embodiment. That is, it converts the level of the signal supplied from the internal circuit of the LSI operated by the first power source system in which the first supply potential VDD1 and grounding potential GND are supplied, delays by a specific time, and supplies into an external circuit of the LSI operated by the second power source system in which the second supply potential VDD2 and grounding potential GND are supplied.

The input circuit unit 10c receives output data signal IN1, output control signal IN2, clock input signal CLK, and set signal SET from the internal circuit, and issues them into the nodes N31, N32, N33, and N34 through D type flip-flops G31 and G32. The D type flip-flops G31 and G32 take in the input data at the edge of the clock input signal CLK, hold the data temporarily, and issue the data at the edge of the clock input signal CLK. By delay of one period of clock input signal CLK, the signal is issued to the output data terminal Q, which is known as D type flip-flop operation. The set signal SET is an input signal which sets the flip-flop internal state directly in set state (the state in which the signal issued from the output data terminal Q is at H level).

The operation of the output circuit unit 11c will now be explained. The operation function table of this output circuit unit 11c same as shown in FIG. 6. The output buffer circuit 12c is supposed to be in the output mode when the output control signal IN2 is at L level, and it is supposed to be in the input mode when the output control signal IN2 is at H level.

In FIG. 7, when the set signal SET is at H level and the output control signal IN2 is at L level, after the D type flip-flop operation of taking in the data at the leading edge of the clock signal, and holding and issuing, the data input signal IN1, reverse phase signal of data input signal IN1, L level signal, and H level signal are issued to the node N31, node N32, node N33, and node N34 respectively.

Therefore, when the L level signal is issued to the node N33 and the H level signal is issued to the node N34, the NMOS transistor MN33 is turned off, and the NMOS transistor MN34 is turned on.

Consequently, the potential at the node N36 drops to the grounding potential GND, and the PMOS transistor MP33 is turned on, and the potential at the drain of the PMOS transistor MP33 raises to the second supply potential VDD2. Therefore, the PMOS transistor MP34 is turned off, and the node N36 becomes L level.

In this state, when the data input signal IN1 becomes H level, a signal of H level is issued to the output data terminal Q of the D type flip-flop G31, that is, at the node N31, and a signal of L level is issued to the reverse phase output data terminal /Q of the D type flip-flop G31, that is, at the node N32. Therefore, the NMOS transistor MN31 is turned on, the potential at the drain of the NMOS transistor MN31 drops to the grounding potential GND, and the PMOS transistor MP32 of which gate is connected to its drain is turned on. At the same time, the NMOS transistor MN32 is turned off.

As the PMOS transistor MP32 is turned on, the potential at the node N35 raises to the second supply potential VDD2, and hence the PMOS transistor MP31 is turned off. Thus, the node N35 becomes H level.

Consequently, the H level signal of the node N35 is fed into one input terminal of the NAND gate G33, and a signal of H level of the drain of the NMOS transistor MN33, that is, the drain of the PMOS transistor PM33 is fed into other input terminal. Therefore, the node N38 which is the output of the NAND gate G33 becomes L level. Thus, the PMOS transistor MP35 is turned on.

In this case, since the H level signal at the node N35 is fed into one input terminal of the NOR gate G34, and the L level signal at the node N36 is fed into other input terminal, the node N39 which is the output of the NOR gate G34 is at L level. Thus, the NMOS transistor MN35 is turned off.

In this manner, as the PMOS transistor MP35 is turned on and the NMOS transistor MN35 is turned off, the potential at the point where the drain of the PMOS transistor MP35 and the drain of the NMOS transistor MN35 are connected raises to the second supply potential VDD2. Thus, the data input signal IN1 at H level of first supply potential VDD1 is issued from the input-output terminal 3 as a signal at H level of second supply potential VDD2.

On the other hand, in this output mode state, when the data input signal IN1 becomes L level, a signal of L level is issued to the output data terminal Q of the D type flip-flop G31, that is, at node N31, whereas a signal of H level is issued to the reverse phase output data terminal /Q of the D type flip-flop G31, that is, at node N32. Consequently, the NMOS transistor MN31 is turned off, and the NMOS transistor MN32 is turned on.

Therefore, the potential at the node N35 drops to the grounding potential GND, and the PMOS transistor MP31 is turned on, so that the potential at the drain of the PMOS transistor MP31 raises to the second supply potential VDD2. Accordingly, the PMOS transistor MP32 is turned off, and the node N35 becomes L level.

Consequently, the L level signal of node N35 is fed into one input terminal of the NAND gate G33, and a signal of H level of the drain of the NMOS transistor MN33, that is, the drain of the PMOS transistor MP33 is fed into other input terminal. Therefore, the node N38 which is the output of the NAND gate G33 becomes H level. Thus, the PMOS transistor MP35 is turned off.

In this case, since the L level signal of node N35 is fed into one input terminal of the NOR gate G34 and the L level signal of node N36 is fed into other input terminal, the node N35 which is the output of the NOR gate G34 becomes H level. Thus, the NMOS transistor MN35 is turned on.

In this manner, as the PMOS transistor MP35 is turned off and the NMOS transistor MN35 is turned on, the potential at the point where the drain of the PMOS transistor MP35 and the drain of the NMOS transistor MN35 are connected drops to the grounding potential GND. Thus, the data input signal IN1 at L level of the internal circuit is also issued as L level signal in the external circuit from the input-output terminal 3.

When the set signal SET is at H level and the output control signal IN2 is at H level, after the D type flip-flop operation of taking in the data at the leading edge of the clock signal, and holding and issuing, the data input signal IN1, reverse phase signal of data input signal IN1, H level signal, and L level signal are issued to the node N31, node N32, node N33, and node N34 respectively.

When the H level signal is issued to the node N33 and the L level signal is issued to the node N34, the NMOS transistor MN33 is turned on, the potential at the drain of the NMOS transistor MN33 falls to the grounding potential GND, and the PMOS transistor MP34 of which gate is connected to its drain is turned on. Thus, the NMOS transistor MN34 is turned off.

The potential at the node N36 raises to the second supply potential VDD2 as the PMOS transistor MP34 is turned on, and the PMOS transistor MP33 is turned off. Thus, the node N36 becomes H level.

In this state, when the data input signal IN1 becomes H level, same as in the above case of the output mode, in the case the node N35 becomes H level and the data input signal IN1 is L level, the node N35 is at L level same as in the case of the output mode above, but in this state, whether the node N35 is at H level or at L level, since L level is fed into one input terminal (node N37) of the NAND gate G33 through the drain of the NMOS transistor MN33, a signal of H level is issued from the output terminal (node N38) of the NAND gate G33. Further, since H level is fed into one input terminal (node N36) of the NOR gate G34, a signal of L level is issued from the output terminal (node N39) of the NOR gate G34.

Therefore, when the set signal SET is at H level and the output control signal IN2 is at H level, regardless of the level of the data input signal IN1, both PMOS transistor MP35 and NMOS transistor MN35 are turned off, and the output buffer circuit 12c is at higher impedance as compared with the input-output terminal 3. It means that the output buffer circuit 12c operates in input mode.

When the set signal SET is at L level, regardless of the level state of the data input signal IN1, output control signal IN2, and clock input signal CLK, signals of H level are issued from the output data terminals Q of the D type flip-flops G31 and G32, and signals of L level are issued from the reverse phase output data terminals /Q. Accordingly, same as when the output control signal IN2 is at H level, both PMOS transistor MP35 and NMOS transistor MN35 are turned off, and the output buffer circuit 12c is at higher impedance as compared with the input-output terminal 3.

As explained above, according to the semiconductor integrated circuit of the third embodiment, the output buffer circuit 12c which converts the level of the signal supplied from the internal circuit of the LSI operated by the first power source system (the power source system in which the first supply potential VDD1 and grounding potential GND are supplied), and, after a certain time delay, issues the signal to the device outside of the LSI operated by the second power source system (the power source system in which the second supply potential VDD2 and grounding potential GND are supplied) is composed by disposing the signal level converting circuit 15 and tri-state type output circuit adjacently to the rear stage of the D type flip-flops, in particular the reverse phase data output of the D type flip-flops is utilized in control of the tri-state type output circuit. Therefore, the input signal IN1 and output control signal IN2 issued from the internal circuit can be individually converted in level and delayed. Further, the route of these signals until being issued to the external circuit is always appropriate in length, and the data signal propagation delay time of the output buffer circuit 12c can be shortened. Furthermore, as compared with the conventional semiconductor integrated circuit with signal level converting function, the number of elements required for configuration can be curtailed.

Figure 8:
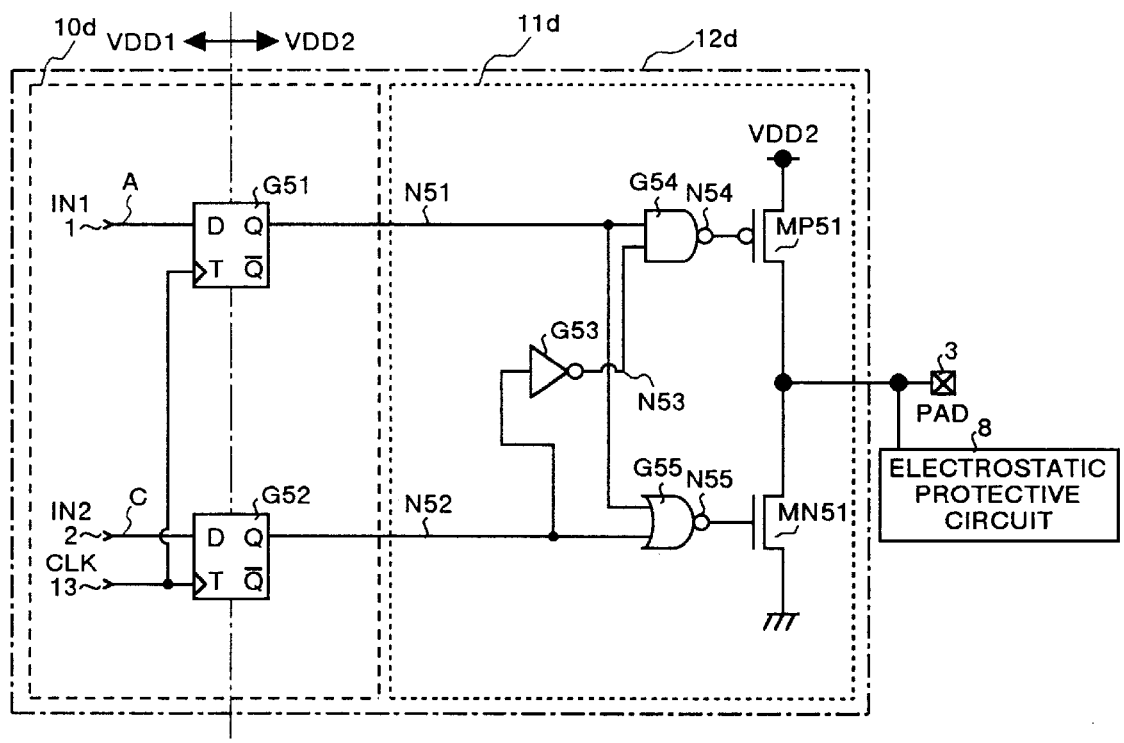
FIG. 8 is a circuit diagram showing a configuration of input-output circuit in a semiconductor integrated circuit in a fourth embodiment of the invention.

A semiconductor integrated circuit in a fourth embodiment will now be explained. FIG. 8 is a circuit diagram showing a configuration of input-output circuit in a semiconductor integrated circuit in the fourth embodiment. Same parts as in FIG. 1 are identified with same reference numerals, and their description is omitted.

The input-output circuit shown in FIG. 8 is composed of an output buffer circuit 12d, the electrostatic protective circuit 8, and the not shown input buffer circuit 9. As shown in FIG. 8, the output buffer circuit 12d is composed of an input circuit unit 10d and an output circuit unit 11d.

In FIG. 8, the symbol "VDD1←" indicates the circuit that operates at the first supply potential VDD1 which is the supply voltage of the internal circuit. On the other hand, and the symbol "→VDD2" indicates the circuit that operates at the second supply potential VDD2. It is assumed here that a relation of VDD2>VDD1>GND holds.

As shown in FIG. 8, the input circuit unit 10d has two signal routes, input signal IN1 from internal circuit and output control signal IN2. D type flip-flops G51 and G52 are disposed in these signal routes respectively. The input circuit unit 10d controls the output of the D type flip-flops G51 and G52 based on the clock input signal CLK, and outputs the output to the output circuit unit 11d at the rear stage through nodes N51 and N52.

As shown in FIG. 8, the D type flip-flop G51 has input data terminal D, output data terminal Q, and clock input terminal T sequentially connected to the input terminal 1, the node N51 and clock terminal 13, and the D type flip-flop G52 has input data terminal D, output data terminal Q, and clock input terminal T connected to the output control terminal 2, the node N52 and clock terminal 13 respectively.

Figure 9A:
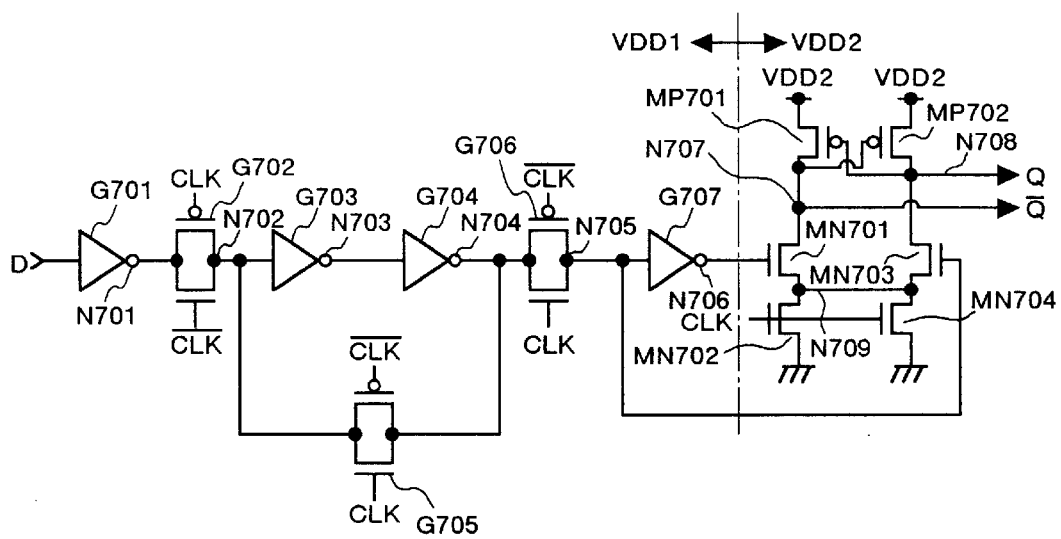
FIG. 9A and FIG. 9B are circuit diagrams showing a configuration of D type flip-flop in the semiconductor integrated circuit in the fourth embodiment.
Figure 9B:
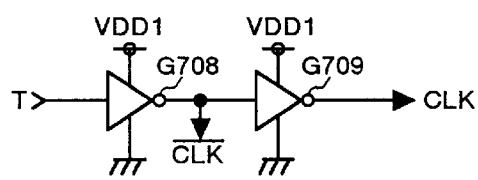

FIG. 9A and FIG. 9B are circuit diagrams showing a configuration of the D type flip-flop G51. The D type flip-flop G52 has the same structure. As shown in FIG. 9A, the D type flip-flop G51 include the signal processing portion operated at the first supply potential VDD1 at the front stage (hereinafter called the VDD1 operation section), and the signal processing portion operated at the second supply potential VDD2 at the rear stage (hereinafter called the VDD2 operation section).

In the D type flip-flops G51, as shown in FIG. 9A, the VDD1 operation section is composed of an inverter G701 having the input terminal connected to the input data terminal D, a transmission gate G702 having the first contact terminal connected to the output terminal of the inverter G701 which receives a clock input signal CLK at the gate of PMOS transistor and receiving a reverse phase clock input signal /CLK at the gate of NMOS transistor, an inverter G703 having the input terminal connected to the second contact terminal of the transmission gate G702, an inverter G704 having the input terminal connected to the output terminal of the inverter G703, a transmission gate G705 having the first contact terminal connected to the second contact terminal of the transmission gate G702 and the second contact terminal connected to the output terminal of the inverter G704 which receives a reverse phase clock input signal /CLK at the gate of PMOS transistor and a clock input signal CLK into the gate of NMOS transistor, a transmission gate G706 having the first contact terminal connected to the output terminal of the inverter G704 which receives a reverse phase clock input signal /CLK at the gate of PMOS transistor and a clock input signal CLK into the gate of NMOS transistor, and an inverter G707 having the input terminal connected to the second contact terminal of the transmission gate G706.

The reverse phase clock input signal /CLK is obtained, as shown in FIG. 9B, from the output terminal of an inverter G708 having the input terminal connected to the clock input terminal T, and the clock input signal CLK is obtained from the output terminal G709 having the input terminal connected to the output terminal of the inverter G708. The configuration shown in FIG. 9B is also a part of the configuration of the D type flip-flop G51.

Also, in the D type flip-flop G51, as shown in FIG. 9A, the VDD2 operation section is composed of a PMOS transistor MP701 having the source connected to the second supply potential VDD2, the gate connected to output data terminal Q, and the drain connected to reverse phase output data terminal /Q, an NMOS transistor MN701 having the drain connected to the drain of the PMOS transistor MP701 and the gate connected to the output terminal of the inverter G707, an NMOS transistor MN702 having the source connected to the grounding potential GND and the drain connected to source of the NMOS transistor MN701 which receives a clock input signal CLK at the gate, a PMOS transistor MP702 having the source connected to the second supply potential VDD2 and the gate connected to the drain of the PMOS transistor MP701, an NMOS transistor MN703 having the drain connected to the drain of PMOS transistor MP702 and the gate of PMOS transistor MP701, the source connected to the drain of NMOS transistor MN702, and the gate connected to the second contact terminal of the transmission gate G706 of the VDD1 operation section, and an NMOS transistor MN704 having the source connected to the grounding potential GND and the drain connected to the drain of the NMOS transistor MN703 which receives a clock input signal CLK at the gate.

The output circuit unit lid is composed of, as shown in FIG. 8, an inverter G53, a two-input NAND gate G54, a two-input NOR gate G55, a PMOS transistor MP51, and an NMOS transistor MN51. The inverter G53 has its input terminal connected to the node N52. The two-input NAND gate G54 has one of its input terminal connected to the node N51 and the other input terminal connected to the output terminal of the inverter G53. The two-input NOR gate G55 has one of its input terminal connected to the node N51 and the other input terminal connected to the node N52. The PMOS transistor MP51 has its source connected to the second supply potential VDD2 and gate connected to the output terminal (node N54) of the NAND gate G54. The NMOS transistor MN51 has its drain connected to the drain of the PMOS transistor MP51, source connected to the grounding potential GND, and gate connected to the output terminal (node N55) of the NOR gate G55. In FIG. 8, the output of data terminal Q is inverted using the inverter G53 and input into the input terminal of the two-input NAND gate G54. However, the output of the reverse phase gate terminal /Q is the reverse of the output of the data terminal Q. Therefore, the output of the reverse phase gate terminal /Q may be input into the input terminal of the two-input NAND gate G54. In this case the inverter G53 will not be required.

The operation of the semiconductor integrated circuit in the fourth embodiment having such configuration is explained below while referring to FIG. 8. The semiconductor integrated circuit of the fourth embodiment operates in the same manner as in the first embodiment. That is, it converts the level of the signal supplied from the internal circuit of the LSI operated by the first power source system in which the first supply potential VDD1 and grounding potential GND are supplied, delays by a specific time, and supplies into an external circuit of the LSI operated by the second power source system in which the second supply potential VDD2 and grounding potential GND are supplied.

The input circuit unit 10d receives output data signal IN1, output control signal IN2, and clock input signal CLK from the internal circuit, and issues them into the nodes N51 and N52 through D type flip-flops G51 and G52. The D type flip-flops G51 and G52 take in the input data at the edge of the clock input signal CLK, hold the data temporarily, and issue the data at the edge of the clock input signal CLK. By delay of one period of clock input signal CLK, the signal is issued to the output data terminal Q, which is known as D type flip-flop operation.

Figure 10:
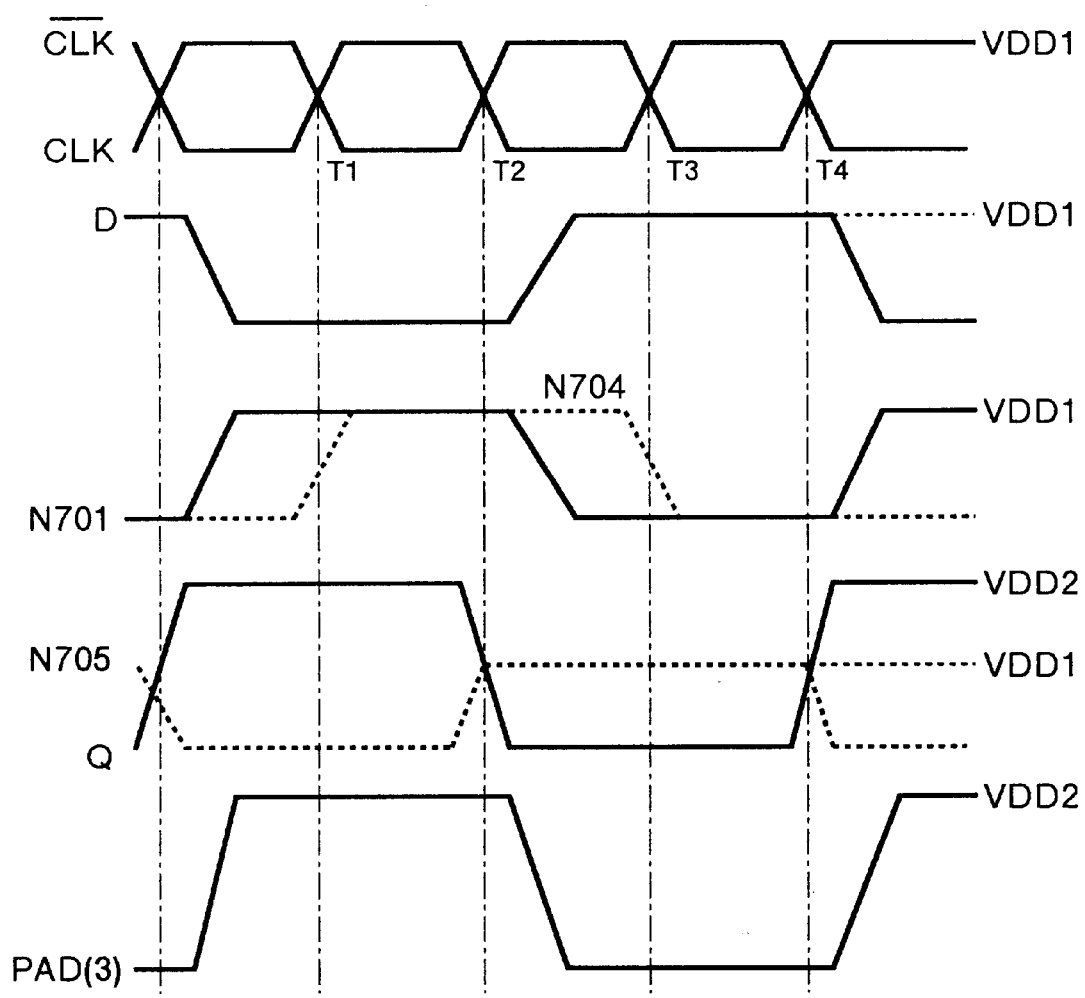
FIG. 10 is a timing chart showing operation timing of the D type flip-flop in the semiconductor integrated circuit in the fourth embodiment.

Operation of D type flip-flops G51 and G52 will be explained here. FIG. 10 is a timing chart showing operation timing of D type flip-flops G51 and G52. In FIG. 10, waveforms CLK, /CLK, D, N701, N704, N705, and Q are the waveforms of the signals at the respective nodes of the D type flip-flop shown in FIG. 9A. PAD (3) corresponds to the input-output terminal 3 shown in FIG. 8.

Supposing the input data D to be at L level, the node N701 of the inverter G701 is at H level, and when the clock input signal CLK is atL level, and the reverse phase clock input signal /CLK is H level (timing T1 in the diagram), the transmission gate G702 is turned on. Therefore, the transmission gates G705 and G706 are both turned off, so that the node N704 becomes H level.

When the clock input signal CLK is at H level and the reverse clock input signal /CLK is L level (timing T2 in the diagram), the transmission gate G702 is turned off, while the transmission gates G705 and G706 are turned on. Therefore, the node N705 becomes H level. Further, since the clock input signal CLK is H level, the NMOS transistors MN702 and MN704 are both turned on, so that the node N709 becomes L level.

At this time, the output terminal (node N706) of the inverter G707 becomes L level, and the NMOS transistor MN701 is turned off. Further, since a signal of H level is fed into the gate of the NMOS transistor MN703, the NMOS transistor MN703 is turned on, and a signal of L level is issued from the output data terminal Q. At this time, the PMOS transistor MN701 having the gate connected to the output data terminal Q (node N708) is turned on, and a signal of H level is output from the reverse phase gate terminal /Q connected to its drain (node N707).

When the clock input signal CLK is at L level and the reverse phase clock input signal /CLK becomes H level (timing T3 in the diagram), the transmission gate G702 is turned on, while the transmission gates G705 and G706 are turned off. Therefore, both NMOS transistors MN702 and MN704 are turned off.

At this time, the node N704 becomes L level, and the node N705 becomes H level. Therefore, a signal of L level is issued from the output data terminal Q, and a signal of H level is issued from the reverse phase output data terminal /Q.

As indicated by "VDD1←" and "→VDD2" in FIG. 9A, the portion positioned before the inverter G707 is operated by the first supply potential VDD1, and the portion positioned behind is operated by the second supply potential VDD2. Thus, the signals (IN1, IN2) defined at the first supply potential VDD1 being fed into the input data terminal D are output from the output data terminal Q and reverse phase output data terminal /Q as the signals defined by the second supply potential VDD2. It means that delay of data by one period and conversion of signal level are executed inside the D type flip-flops G51 and G52.

The operation of the output circuit unit 11d will now be explained. FIG. 11 is an operation function table of this output circuit unit 11d. The output buffer circuit 12d is supposed to be in the output mode when the output control signal IN2 is at L level, and it is supposed to be in the input mode when the output control signal IN2 is at H level.

In FIG. 8, when the output control signal IN2 is at L level, after the D type flip-flop operation of taking in the data at the leading edge of the clock signal, and holding and issuing, the data input signal IN1 and L level signal are sequentially issued to the node N51 and node N52.

In this state, when the data input signal IN1 is at H level, a signal of H level is issued to the output data terminal Q of the D type flip-flop G51, that is, at the node N51. Consequently, a signal of H level of node N51 is fed into one input terminal of the NAND gate G54, and a signal of H level converted from the L level signal of node N52 is fed into other input terminal through the inverter G53. Therefore, the level is L at the node N54 which is the output of the NAND gate G54. Thus, the PMOS transistor MP51 is turned on.

In this case, since the H level signal at the node N55 is fed into one input terminal of the NOR gate G55, and the L level signal at the node N52 is fed into other input terminal, the node N55 which is the output of the NOR gate G55 is at L level. Thus, the NMOS transistor MN51 is turned off.

In this manner, as the PMOS transistor MP51 is turned on and the NMOS transistor MN51 is turned off, the potential at the point at which the drain of the PMOS transistor MP51 and the drain of the NMOS transistor MN51 are connected raises to the second supply potential VDD2. Thus, the data input signal IN1 at H level of first supply potential VDD1 is issued from the input-output terminal 3 as a signal at H level of second supply potential VDD2.

On the other hand, in this output mode state, when the data input signal IN1 becomes L level, a signal of L level is issued to the output data terminal Q of the D type flip-flop G51, that is, at node N51. Consequently, a signal of L level of node N51 is fed into one input terminal of the NAND gate G54, and a signal of H level converted from the L level signal of node N52 is fed into other input terminal through the inverter G53. Therefore, the level is H at the node N54 which is the output of the NAND gate G54. Thus, the PMOS transistor MP51 is turned off.

In this case, since the L level signal of node N51 is fed into one input terminal of the NOR gate G55 and the L level signal of node N52 is fed into other input terminal, the node N55 which is the output of the NOR gate G55 becomes H level. Thus, the NMOS transistor MN51 is turned on.

In this manner, as the PMOS transistor MP51 is turned off and the NMOS transistor MN51 is turned on, the potential at the point at which the drain of the PMOS transistor MP51 and the drain of the NMOS transistor MN51 are connected drops to the grounding potential GND. Thus, the data input signal IN1 at L level of the internal circuit is also issued as L level signal in the external circuit from the input-output terminal 3.

When the output control signal IN2 is at H level, after the D type flip-flop operation of taking in the data at the leading edge of the clock signal, and holding and issuing, the data input signal IN1 and H level signal are sequentially issued to the node N51 and node N52.

In this state, when the data input signal IN1 becomes H level, the node N51 becomes H level, and when the data input signal IN1 becomes L level, the node N51 is at L level. However, in this state, whether the node N51 is at H level or at L level, since L level is fed into one input terminal (node N53) of the NAND gate G54 through the inverter G53, a signal of H level is issued from the output terminal (node N54) of the NAND gate G54. Also, since H level is fed into one input terminal (node N52) of the NOR gate G55, a signal of L level is issued from the output terminal (node N55) of the NOR gate G55.

Therefore, if the output control signal IN2 is at H level, regardless of the level of the data input signal IN1, both PMOS transistor MP51 and NMOS transistor MN51 are turned off, and the output buffer circuit 12d is at higher impedance as compared with the input-output terminal 3. It means that the output buffer circuit 12d operates in input mode.

As explained above, according to the semiconductor integrated circuit of the fourth embodiment, the output buffer circuit 12d which converts the level of the signal supplied from the internal circuit of the LSI operated by the first power source system (the power source system in which the first supply potential VDD1 and grounding potential GND are supplied), and, after a certain time delay, issues the signal to the device outside of the LSI operated by the second power source system (the power source system in which the second supply potential VDD2 and grounding potential GND are supplied) is composed by disposing the tri-state type output circuit adjacently to the rear stage of the D type flip-flops, and in particular the D type flip-flops function to convert the signal level in the inside. Therefore, the input signal IN1 and output control signal IN2 issued from the internal circuit can be individually converted in level and delayed. Further, the route of these signals until being issued to the external circuit is always appropriate in length, and the data signal propagation delay time of the output buffer circuit 12d can be shortened. Furthermore, as compared with the conventional semiconductor integrated circuit with signal level converting function, the number of elements required for configuration can be curtailed.

Figure 12:
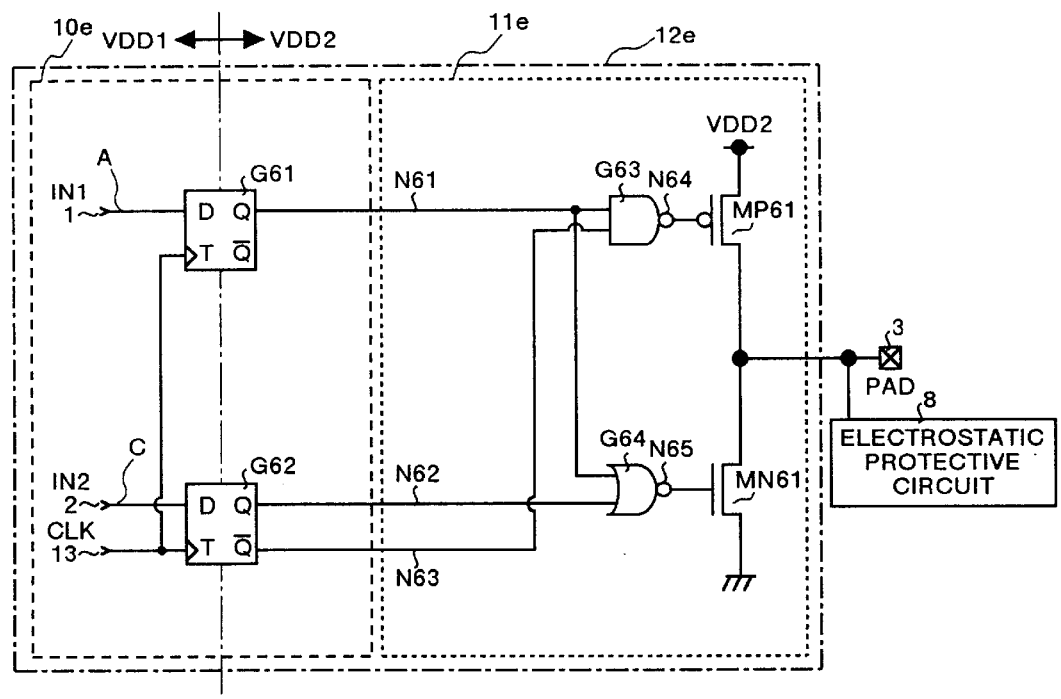
FIG. 12 is a circuit diagram showing a configuration of input-output circuit in a semiconductor integrated circuit in a fifth embodiment of the invention.

A semiconductor integrated circuit in a fifth embodiment will now be explained. FIG. 12 is a circuit diagram showing a configuration of input-output circuit in a semiconductor integrated circuit in the fifth embodiment. Same parts as in FIG. 1 are identified with same reference numerals, and their description is omitted.

The input-output circuit shown in FIG. 12 is composed of an output buffer circuit 12e, the electrostatic protective circuit 8, and the not shown input buffer circuit 9. As shown in FIG. 12, the output buffer circuit 12e is composed of an input circuit unit 10e and an output circuit unit 11e.

In FIG. 12, the symbol "VDD1←" indicates the circuit that operates at the first supply potential VDD1 which is the supply voltage of the internal circuit. On the other hand, and the symbol "→VDD2" indicates the circuit that operates at the second supply potential VDD2. It is assumed here that a relation of VDD2>VDD1>GND holds.

As shown in FIG. 12, the input circuit unit 10e has two signal routes, input signal IN1 from internal circuit and output control signal IN2. D type flip-flops G61 and G62 are disposed in these signal routes respectively. The input circuit unit 10e controls the output of the D type flip-flops G61 and G62 based on the by clock input signal CLK, and outputs the output to the output circuit unit 11e at the rear stage through nodes N61, N62, and N63.

As shown in FIG. 12, the D type flip-flop G61 has input data terminal D, output data terminal Q, and clock input terminal T sequentially connected to the input terminal 1, node N61 and clock terminal 13, and the D type flip-flop G62 has input data terminal D, output data terminal Q, reverse phase output data terminal /Q, and clock input terminal T connected to the output control terminal 2, node N62, node N63 and clock terminal 13 respectively. The D type flip-flops G61 and G62 are same in configuration as the D type flip-flops shown in FIG. 9A and FIG. 9B in relation to the fourth embodiment, and the description is omitted.

The output circuit unit 11e is composed of, as shown in FIG. 12, a two-input NAND gate G63, a two-input NOR gate G64, a PMOS transistor MP61, and an NMOS transistor MN61. The two-input NAND gate G63 has one of its input terminal connected to the node N61 and the other input terminal connected to the node N63. The two-input NOR gate G64 has one of its input terminal connected to the node N61 and the other input terminal connected to the node N62. The PMOS transistor MP61 has its source connected to the second supply potential VDD2 and gate connected to the output terminal (node N64) of the NAND gate G63. The NMOS transistor MN61 has its drain connected to the drain of the PMOS transistor MP61, source connected to the grounding potential GND, and gate connected to the output terminal (node N65) of the NOR gate G64.

The operation of the semiconductor integrated circuit in the fifth embodiment having such configuration is explained below while referring to FIG. 12. The semiconductor integrated circuit of the fifth embodiment operates in the same manner as in the first embodiment. That is, it converts the level of the signal supplied from the internal circuit of the LSI operated by the first power source system in which the first supply potential VDD1 and grounding potential GND are supplied, delays by a specific time, and supplies into an external circuit of the LSI operated by the second power source system in which the second supply potential VDD2 and grounding potential GND are supplied.

The input circuit unit 10e receives output data signal IN1, output control signal IN2, and clock input signal CLK from the internal circuit, and issues them into the nodes N61, N62, and N63 through D type flip-flops G61 and G62. The D type flip-flops G61 and G62 take in the input data at the edge of the clock input signal CLK, hold the data temporarily, and issue the data at the edge of the clock input signal CLK. By delay of one period of clock input signal CLK, the signal is issued to the output data terminal Q and reverse phase output data terminal /Q, which is known as D type flip-flop operation.

The operation of the output circuit unit 11e is explained. The operation function table of this output circuit unit 11e is same as shown in FIG. 11. The output buffer circuit 12e is supposed to be in the output mode when the output control signal IN2 is at L level, and it is supposed to be in the input mode when the output control signal IN2 is at H level.

In FIG. 12, when the output control signal IN2 is at L level, after the D type flip-flop operation of taking in the data at the leading edge of the clock signal, and holding and issuing, the data input signal IN1, L level signal, and H level signal are issued to the node N61, node N62, and node N63 respectively.

In this state, when the data input signal IN1 is at H level, a signal of H level is issued to the output data terminal Q of the D type flip-flop G61, that is, at the node N61. As a result, a signal of H level of node N61 is fed into one input terminal of the NAND gate G63, and a signal of H level of node N63 is fed into other input terminal, and therefore the level is L at the node N64 which is the output of the NAND gate G63. Thus, the PMOS transistor MP61 is turned on.

In this case, since the H level signal at the node N65 is fed into one input terminal of the NOR gate G64, and the L level signal at the node N62 is fed into other input terminal, the node N65 which is the output of the NOR gate G64 is at L level. Thus, the NMOS transistor MN61 is turned off.

In this manner, as the PMOS transistor MP61 is turned on and the NMOS transistor MN61 is turned off, the potential at the point at which the drain of the PMOS transistor MP61 and the drain of the NMOS transistor MN61 are connected raises to the second supply potential VDD2. Thus, the data input signal IN1 at H level of first supply potential VDD1 is issued from the input-output terminal 3 as a signal at H level of second supply potential VDD2.

On the other hand, in this output mode state, when the data input signal IN1 becomes L level, a signal of L level is issued to the output data terminal Q of the D type flip-flop G61, that is, at node N61. Consequently, a signal of L level of node N61 is fed into one input terminal of the NAND gate G63, and a signal of H level of node N63 is fed into other input terminal. Therefore, the level is H at the node N64 which is the output of the NAND gate G63. Thus, the PMOS transistor MP61 is turned off.

In this case, since the L level signal of node N61 is fed into one input terminal of the NOR gate G64 and the L level signal of node N62 is fed into other input terminal, the node N65 which is the output of the NOR gate G64 becomes H level. Thus, the NMOS transistor MN61 is turned on.

In this manner, as the PMOS transistor MP61 is turned off and the NMOS transistor MN61 is turned on, the potential at the point at which the drain of the PMOS transistor MP61 and the drain of the NMOS transistor MN61 are connected drops to the grounding potential GND. Thus, the data input signal IN1 at L level of the internal circuit is also issued as L level signal in the external circuit from the input-output terminal 3.

When the output control signal IN2 is at H level, after the D type flip-flop operation of taking in the data at the leading edge of the clock signal, and holding and issuing, the data input signal IN1, H level signal, and L level signal are issued to the node N61, node N62, and node N63 respectively.

In this state, when the data input signal IN1 becomes H level, the node N61 becomes H level, and when the data input signal IN1 becomes L level, the node N61 is at L level, but in this state, whether the node N61 is at H level or at L level, since L level is fed into one input terminal (node N64) of the NAND gate G63 through the node N63, a signal of H level is issued from the output terminal (node N64) of the NAND gate G63. Further, since H level is fed into one input terminal (node N62) of the NOR gate G64, a signal of L level is issued from the output terminal (node N65) of the NOR gate G64.

Therefore, when the output control signal IN2 is at H level, regardless of the level of the data input signal IN1, both PMOS transistor MP61 and NMOS transistor MN61 are turned off, and the output buffer circuit 12e is at higher impedance as compared with the input-output terminal 3. It means that the output buffer circuit 12e operates in input mode.

As explained above, according to the semiconductor integrated circuit of the fifth embodiment, the output buffer circuit 12e which converts the level of the signal supplied from the internal circuit of the LSI operated by the first power source system (the power source system in which the first supply potential VDD1 and grounding potential GND are supplied), and, after a certain time delay, issues the signal to the device outside of the LSI operated by the second power source system (the power source system in which the second supply potential VDD2 and grounding potential GND are supplied) is composed by disposing the tri-state type output circuit adjacently to the rear stage of the D type flip-flops, and in particular the D type flip-flops function to convert the signal level in the inside and the reverse phase data output of the D type flip-flops is utilized in control of the tri-state type output circuit. Therefore, the input signal IN1 and output control signal IN2 issued from the internal circuit can be individually converted in level and delayed. Further, the route of these signals until being issued to the external circuit is always appropriate in length, and the data signal propagation delay time of the output buffer circuit 12e can be shortened. Furthermore, as compared with the conventional semiconductor integrated circuit with sig- nal level converting function, the number of elements required for configuration can be curtailed.

A semiconductor integrated circuit in a sixth embodiment will now be explained. The sixth embodiment is an other example of internal configuration of the flip-flops G51 and G52 which compose the input circuit unit 10d explained in the fourth embodiment, or the flip-flops G61 and G62 which compose the input circuit unit 10e explained in the fifth embodiment, and other components are same as in the fourth or fifth embodiments, and their description is omitted herein.

Figure 13:
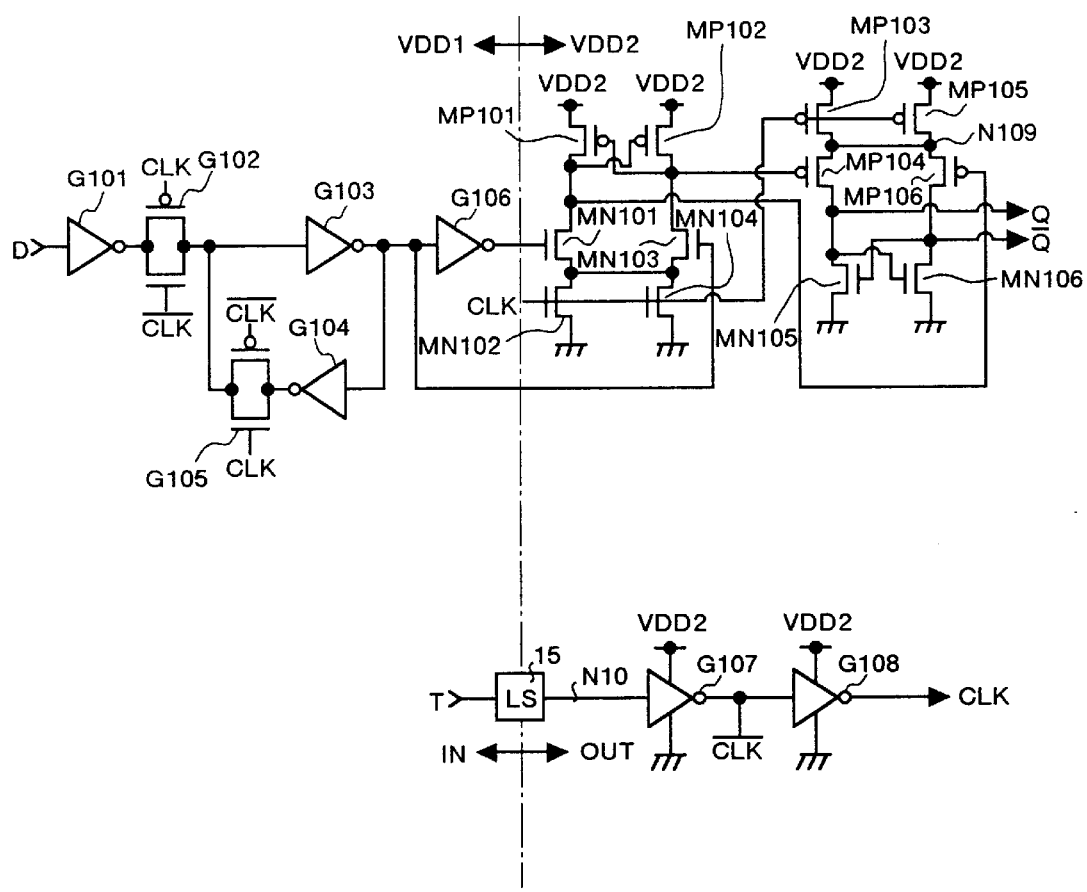
FIG. 13 is a circuit diagram showing a configuration of a D type flip-flop of an input circuit unit in a semiconductor integrated circuit in a sixth embodiment of the invention.

FIG. 13 is a circuit diagram showing a configuration of D type flip-flops which compose the input circuit unit in the semiconductor integrated circuit in the sixth embodiment. The D type flip-flops shown in FIG. 13 include the signal processing portion operated at the first supply potential VDD1 at the front stage (hereinafter called the VDD1 operation section), and the signal processing portion operated at the second supply potential VDD2 at the rear stage (hereinafter called the VDD2 operation section).

In FIG. 13, the VDD1 operation section is composed of an inverter G101 having the input terminal connected to the input data terminal D, a transmission gate G102 having the first contact terminal connected to the output terminal of the inverter G101 which receives a clock input signal CLK at the gate of PMOS transistor and receiving a reverse phase clock input signal /CLK at the gate of NMOS transistor, an inverter G103 having the input terminal connected to the first contact terminal of the transmission gate G102, an inverter G104 having the input terminal connected to the output terminal of the inverter G103, a transmission gate G105 having the first contact terminal connected to the second contact terminal of the transmission gate G102 and the second contact terminal connected to the output terminal of the inverter G104 which receives a reverse phase clock input signal /CLK at the gate of PMOS transistor and a clock input signal CLK into the gate of NMOS transistor, and an inverter G106 having the input terminal connected to the output terminal of the inverter G103.

Also in FIG. 13, the VDD2 operation section is composed of a PMOS transistor MP101 having the source connected to the second supply potential VDD2, an NMOS transistor MN101 having the drain connected to the drain of the PMOS transistor MP101 and the gate connected to output terminal of an inverter G106, an NMOS transistor MN102 having the source connected to the grounding potential GND and the drain connected to source of the NMOS transistor MN101 which receives a clock input signal CLK at the gate, a PMOS transistor MP102 having the source connected to the second supply potential VDD2 and the gate connected to the drain of the PMOS transistor MP101, an NMOS transistor MN103 having the drain connected to the drain of PMOS transistor MP102 and the gate of PMOS transistor MP101, the source connected to the drain of NMOS transistor MN102, and the gate connected to the second contact terminal of the transmission gate G106 of the VDD1 operation section, and an NMOS transistor MN104 having the source connected to the grounding potential GND and the drain connected to the drain of the NMOS transistor MN103 which receives a clock input signal CLK at the gate.

The VDD2 operation section further comprises a PMOS transistor MP103 having the source connected to the second supply potential VDD2 which receives a clock input signal CLK at the gate, a PMOS transistor MP104 having the source connected to the drain of the PMOS transistor MP103 and the gate connected to the drain of the PMOS transistor MP102, an NMOS transistor MN105 having the source connected to the grounding potential GND and the drain connected to the drain of the PMOS transistor MP104 and the output data terminal Q, a PMOS transistor MP105 having the source connected to the second supply potential VDD2 which receives a clock input signal CLK at the gate, a PMOS transistor MP106 having the source connected to the drain of the PMOS transistor MP105 and the drain of the PMOS transistor MP103 and the gate connected to the drain of the NMOS transistor MN101, and an NMOS transistor MN106 having the source connected to the grounding potential GND, the gate connected to the drain of the NMOS transistor MN105, and the drain connected to the drain of the PMOS transistor MP106, to the gate of the NMOS transistor MN105, and to the reverse phase output data terminal /Q.

The D type flip-flop partly includes, as shown in the lower portion of FIG. 13, a structure composed of a signal level converting circuit 15 (same as shown in FIG. 2) having the input terminal "in" connected to the clock input terminal T, an inverter G107 having the input terminal connected to the output terminal "out" of the signal level converting circuit 15 which operates at the second supply potential VDD2, and an inverter G108 having the input terminal connected to the output terminal of the inverter G107 which operates at the second supply potential VDD2. The clock input signal CLK is obtained from the output terminal of the inverter G108, and the reverse phase clock input signal /CLK is obtained from the output terminal of the inverter G107.

The D type flip-flop having such configuration operates same as the D type flip-flop explained in the fourth embodiment, that is, it takes in the input data at the edge of the clock input signal CLK, holds the data temporarily, and issues the data at the edge of the clock input signal CLK. In addition to this so-called D type flip-flop function by which the signal is output to the data output terminal Q by delaying one round period of the clock input signal CLK, the D type flip-flop also has the so-called signal level converting function by which the signal entered in the input data terminal D and defined by the first supply potential VDD1 is issued from the data output terminal Q and the reverse phase output data terminal /Q as a signal defined by the second supply potential VDD2.

As explained above, according to the semiconductor integrated circuit of the sixth embodiment, the output buffer circuit 12d(12e) which converts the level of the signal supplied from the internal circuit of the LSI operated by the first power source system (the power source system in which the first supply potential VDD1 and grounding potential GND are supplied), and, after a certain time delay, issues the signal to the device outside of the LSI operated by the second power source system (the power source system in which the second supply potential VDD2 and grounding potential GND are supplied) is composed by disposing the tri-state type output circuit adjacently to the rear stage of the D type flip-flops, and in particular the D type flip-flops function to convert the signal level in the inside. Therefore, the input signal IN1 and output control signal IN2 issued from the internal circuit can be individually converted in level and delayed. Further, the route of these signals until being issued to the external circuit is always appropriate in length, and the data signal propagation delay time of the output buffer circuit 12d (12e) can be shortened. Furthermore, as compared with the conventional semiconductor integrated circuit with signal level converting function, the number of elements required for configuration can be curtailed.

According to one aspect of the invention, the input-output circuit which converts the level of the signal supplied from the internal circuit of the LSI operated by the first power source system (the power source system in which the first supply potential and grounding potential are supplied), and, after a certain time delay, issues the signal to the device outside of the LSI operated by the second power source system (the power source system in which the second supply potential and grounding potential are supplied) is composed by disposing a flip-flop circuit between the input circuit unit and tri-state type output circuit. Therefore, the first data signal and first control signal issued from the internal circuit can be individually converted in level and delayed. Further, the route of these signals until being issued to the external circuit is always appropriate in length, and the data signal propagation delay time of the input-output circuit can be shortened. Furthermore, as compared with the conventional semiconductor integrated circuit with signal level converting function, the number of elements required for configuration can be curtailed.

Further, the first clock signal and/or first set signal of the first power source system for data output control of the flip-flop circuit is also converted in level to the voltage level of the second power source system. Therefore, for controlling the flip-flop circuit in the second power source system, the level-converted second clock signal and/or second set signal can be utilized.

According to another aspect of the invention, the input-output circuit which converts the level of the signal supplied from the internal circuit of the LSI operated by the first power source system (the power source system in which the first supply potential and grounding potential are supplied), and, after a certain time delay, issues the signal to the device outside of the LSI operated by the second power source system (the power source system in which the second supply potential and grounding potential are supplied) is composed by disposing the input circuit unit and tri-state type output circuit adjacently to the rear stage of the flip-flop circuit. Therefore, the first data signal and first control signal issued from the internal circuit can be individually converted in level and delayed. Further, the route of these signals until being issued to the external circuit is always appropriate in length, and the data signal propagation delay time of the input-output circuit can be shortened. Furthermore, as compared with the conventional semiconductor integrated circuit with signal level converting function, the number of elements required for configuration can be curtailed.

According to still another aspect of the invention, the input-output circuit which converts the level of the signal supplied from the internal circuit of the LSI operated by the first power source system (the power source system in which the first supply potential and grounding potential are supplied), and, after a certain time delay, issues the signal to the device outside of the LSI operated by the second power source system (the power source system in which the second supply potential and grounding potential are supplied) is composed by disposing the tri-state type output circuit adjacently to the rear stage of the flip-flop circuit. In particular, the flip-flop circuit functions to convert the level in its inside. Therefore, the first data signal and first control signal issued from the internal circuit can be individually converted in level and delayed inside of the flip-flop circuit, so that the data signal propagation delay time of the input-output circuit can be further shortened.

Further, the input-output circuit which converts the level of the signal supplied from the internal circuit of the LSI operated by the first power source system (the power source system in which the first supply potential and grounding potential are supplied), and, after a certain time delay, issues the signal to the device outside of the LSI operated by the second power source system (the power source system in which the second supply potential and grounding potential are supplied) is composed by disposing the tri-state type output circuit adjacently to the rear stage of the flip-flop circuit. In particular, the flip-flop circuit functions to convert the level in its inside after delaying in the delaying unit. Therefore, the first data signal and first control signal issued from the internal circuit can be individually converted in level and delayed inside of the flip-flop circuit, so that the data signal propagation delay time of the input-output circuit can be further shortened.

Further, the input-output circuit which converts the level of the signal supplied from the internal circuit of the LSI operated by the first power source system (the power source system in which the first supply potential and grounding potential are supplied), and, after a certain time delay, issues the signal to the device outside of the LSI operated by the second power source system (the power source system in which the second supply potential and grounding potential are supplied) is composed by disposing the tri-state type output circuit adjacently to the rear stage of the flip-flop circuit. In particular, the flip-flop circuit functions to convert the level of the first clock signal as well as the first data signal and first control signal in its inside. Therefore, the first data signal and first control signal issued from the internal circuit can be individually converted in level and delayed, and the second clock signal converted into the level of the second power source system can be utilized in control of the tri-state type output circuit of the second power source system, so that the data signal propagation delay time of the input-output circuit can be further shortened.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit comprising:

a first power source system providing a first supply potential and a grounding potential;

a second power source system providing a second supply potential different from the first supply potential, and a grounding potential;

input-output circuits which convert voltage levels of signals exchanged between said first power source system and said second power source system;

an input circuit receiving a first data signal and a first control signal issued from an internal circuit operated by said first power source system, converting each voltage level of the first data signal and the first control signal to a voltage level of said second power source system, and outputting a second data signal and a second control signal;

a flip-flop circuit, operated by said second power source system, and issuing the second data signal and the second control signal after respective delay times; and a tri-state output circuit, operated by said second power source system, controlling output of the second data signal depending on the second control signal.

2. The semiconductor integrated circuit of claim 1, wherein said input circuit receives a first clock signal and/or first set signal controlling data output of said flip-flop circuit, output from the internal circuit, converts each voltage level of the first clock signal and/or first set signal into a voltage level of said second power source system, and outputs the second clock signal and/or the second set signal.

3. A semiconductor integrated circuit comprising:

a first power source system providing a first supply potential and a grounding potential;

a second power source system providing a second supply potential different from the first supply potential and a grounding potential;

input-output circuits which convert voltage levels of signals exchanged between said first power source system and said second power source system;

a flip-flop circuits operated by said first power source system, receiving a first data signal and a first control signal issued from an internal circuit operated by said first power source system, and issuing the first data signal and first control signal after respective delay times;

an input circuit operated by said second power source system, receiving the first data signal and the first control signal issued from said flip-flop circuit, converting each voltage level of the first data signal and the first control signal into a voltage level of said second power source system, and issuing a second data signal and a second control signal, and a tri-state output circuit, operated by said second power source system, controlling output of the second data signal depending on the second control signal.

4. A semiconductor integrated circuit comprising:

a first power source system providing a first supply potential and a grounding potential;

a second power source system providing a second supply potential different from the first supply potential, and a grounding potential;

input-output circuits which convert voltage levels of signals exchanged between said first power source system and said second power source system;

a flip-flop circuit receiving a first data signal and a first control signal issued from a first internal circuit operated by said first power source system, delaying the first data signal and the first control signal by respective delay times, converting each voltage level of the first data signal and the first control signal into a voltage level of said second power source system, and issuing a second data signal and a second control signal respectively; and a tri-state output circuit, operated by said second power source system, controlling output of the second data signal depending on the second control signal.

5. The semiconductor integrated circuit of claim 4, wherein said flip-flop circuit comprises:

a delay unit, operated by said first power source system, delaying the first data signal and the first control signal by respective delay times; and a level converting unit, operated by said second power source system, converting each voltage level of the first data signal and the first control signal delayed by said delay unit into a voltage level of said second power source system.

6. The semiconductor integrated circuit of claim 4, wherein said flip-flop circuit comprises:

a delay unit, operated by said first power source system, delaying the first data signal and the first control signal by respective delay times;

a first level converting unit, operated by said second power source system, converting each voltage level of the first data signal and the first control signal delayed by said delay unit into a voltage level of said second power source system; and a second level converting unit receiving a first clock signal controlling data output of said delay unit and issued from a second internal circuit operated by said first power source system, converting the voltage level of the first clock signal into a voltage level of said second power source system, and a second clock signal, wherein said first level converting unit outputs the second data signal and the second control signal at a timing corresponding to the second clock signal.

* * * * *